United States Patent
Heiden et al.

(10) Patent No.: US 11,515,453 B2
(45) Date of Patent: Nov. 29, 2022

(54) LIGHT-CONVERTING MATERIAL WITH SEMICONDUCTOR NANOPARTICLES, PROCESS FOR ITS PREPARATION, AND LIGHT SOURCE

(71) Applicant: LITEC-VERMÖGENSVER-WALTUNGSGESELLSCHAFT MBH, Greifswald (DE)

(72) Inventors: Eric Heiden, Greifswald (DE); Mathias Rapphahn, Greifswald (DE)

(73) Assignee: LITEC-VERMÖGENSVER-WALTUNGSGESELLSCHAFT MBH, Greifswald (DE)

( * ) Notice: Subject to any disclaimer, the term of this patent is extended or adjusted under 35 U.S.C. 154(b) by 281 days.

(21) Appl. No.: 16/954,580

(22) PCT Filed: Dec. 17, 2018

(86) PCT No.: PCT/EP2018/085120
§ 371 (c)(1),
(2) Date: Jun. 17, 2020

(87) PCT Pub. No.: WO2019/121455
PCT Pub. Date: Jun. 27, 2019

(65) Prior Publication Data
US 2020/0335670 A1   Oct. 22, 2020

(30) Foreign Application Priority Data
Dec. 18, 2017   (EP) .................... 17208177

(51) Int. Cl.
*H01L 33/50*   (2010.01)
*C09K 11/77*   (2006.01)
(Continued)

(52) U.S. Cl.
CPC ........ *H01L 33/502* (2013.01); *C09K 11/0883* (2013.01); *C09K 11/703* (2013.01);
(Continued)

(58) Field of Classification Search
CPC . H01L 33/502; C09K 11/0883; C09K 11/703; C09K 11/7734; C09K 11/883; B82Y 20/00; B82Y 40/00
See application file for complete search history.

(56) References Cited

U.S. PATENT DOCUMENTS

| | | | |
|---|---|---|---|
| 7,102,152 | B2 | 9/2006 | Chua et al. |
| 7,318,651 | B2 | 1/2008 | Chua et al. |

(Continued)

FOREIGN PATENT DOCUMENTS

| WO | 2007/002234 A1 | 1/2007 |
|---|---|---|
| WO | 17004145 A1 | 1/2017 |

OTHER PUBLICATIONS

Jan Ziegler et al: "Silica-Coated InP/ZnS Nanocrystals as Converter Material in White LEDs", Advanced Materials, Wiley-VCH Germany, DE, Bd. 20, Nr. 21, Nov. 3, 2008 (Nov. 3, 2008), Seiten 4068-4073, XP002639985.

(Continued)

*Primary Examiner* — Tracie Y Green
(74) *Attorney, Agent, or Firm* — Stuart H. Mayer; Mayer & Williams PC

(57) ABSTRACT

The present invention relates to a light-converting material which comprises a luminescent material with semiconductor nanoparticles (quantum materials), where the semiconductor nanoparticles are located on the surface of the luminescent material and the emission from the semiconductor nanoparticles is in the region of the emission from the luminescent material. The present invention furthermore relates to a process for the preparation of the light-converting material and to the use thereof in a light source. The present invention furthermore relates to a light-converting mixture, a light (Continued)

source, a lighting unit which contains the light-converting material according to the invention, and a process for the production thereof.

14 Claims, 5 Drawing Sheets

(51) Int. Cl.
    *C09K 11/88*     (2006.01)
    *C09K 11/70*     (2006.01)
    *C09K 11/08*     (2006.01)
    *B82Y 20/00*     (2011.01)
    *B82Y 40/00*     (2011.01)

(52) U.S. Cl.
    CPC ........ *C09K 11/7734* (2013.01); *C09K 11/883* (2013.01); *B82Y 20/00* (2013.01); *B82Y 40/00* (2013.01)

(56) References Cited

U.S. PATENT DOCUMENTS

| | | | |
|---|---|---|---|
| 7,495,383 B2 | 2/2009 | Chua et al. | |
| 9,701,897 B2* | 7/2017 | Xu | C08G 77/382 |
| 9,780,266 B2 | 10/2017 | Lotito et al. | |
| 10,436,973 B2* | 10/2019 | Wang | C09K 11/025 |
| 11,198,270 B2* | 12/2021 | Dubrow | G02B 6/0055 |
| 2005/0135079 A1 | 6/2005 | Yin Chua et al. | |
| 2013/0341590 A1 | 12/2013 | Gupta et al. | |
| 2015/0014728 A1 | 1/2015 | Do | |
| 2015/0312990 A1 | 10/2015 | Van De | |

OTHER PUBLICATIONS

International Search report PCT/2018EP/085120 dated Mar. 20, 2019 (pp. 1-2).
Pan, Yuexiao et al. "Tailored photoluminescence of YAG:Ce phosphor through various methods" in Journal of Physics and Chemistry of Solids 65 (2004) 845-850.

* cited by examiner

LIGHT-CONVERTING MATERIAL WITH SEMICONDUCTOR NANOPARTICLES, PROCESS FOR ITS PREPARATION, AND LIGHT SOURCE

SUBJECT-MATTER OF THE INVENTION

The present invention relates to a light-converting material which comprises a luminescent material with semiconductor nanoparticles (quantum materials), where the semiconductor nanoparticles are located on the surface of the luminescent material and the emission from the semiconductor nanoparticles is in the region of the emission from the luminescent material. The invention furthermore relates to a process for the preparation of the light-converting material and to the use thereof as conversion material in a light source for the partial or complete conversion of light from a primary light source. The luminescent material can be a downconverter or an upconverter. In the case of a downconverter, the light from the primary light source is of shorter wavelength and higher energy than the emitted light, for example ultraviolet and/or blue light can be converted into light having a longer wavelength. In the case of an upconverter, the light from the primary light source is of longer wavelength and lower energy than the emitted light, for example a number of infrared photons can be converted into a photon having a shorter wavelength. The present invention furthermore relates to a light-converting mixture, a light source, a process for the production of the light source and a lighting unit which contains the light-converting material according to the invention.

BACKGROUND OF THE INVENTION

About 20% of energy consumption in Germany is for the generation of light. Conventional incandescent lamps are inefficient, and the most efficient fluorescent lamps contain up to 10 mg of mercury. Solid-state lighting devices, such as, for example, light-emitting diodes (LEDs), are a highly promising alternative, since they have better efficiency in the conversion of electrical energy into light (energy efficiency), a longer lifetime and higher mechanical stability than conventional light sources. LEDs can be used in multifarious applications, including displays, motor vehicle and sign illumination and domestic and street lighting. Depending on the inorganic semiconductor compound used for its production, an LED can emit monochromatic light in various regions of the spectrum. However, "white" light, which is necessary for much of the lighting industry, cannot be generated using a conventional LED. Current solutions for the generation of white light include either the use of three or more LEDs having different colours (for example red, green and blue or "RGB") or the use of a colour conversion layer comprising a conventional phosphor material (for example YAG:Ce) for the generation of white light from ultraviolet (UV) or blue emission of an LED. Thus, blue light is converted into light having a longer wavelength, and the combination of blue and yellow light is perceived as white light by the human eye. However, white light of this type is virtually never ideal and has in many cases undesired or unpleasant properties, which may require improvement or correction. The simpler construction of conversion LEDs is directed to the mass market of lighting devices. At present, these LED lamps are still significantly more expensive than conventional incandescent lamps and most fluorescent lamps, and the commercially available white LEDs emit a bluish, cold-white light having poor colour reproduction properties. This quality of white light which is perceived as poor originates from the yellow conversion phosphor material YAG:Ce owing to the lack of emission in the green and red parts of the spectrum.

For displays, it is important to have three or more primary colours having a narrow spectral full width at half maximum (FWHM), which are obtained with LEDs (typical FWHM<30 nm). This enables a large gamut to be covered. "Gamut" is normally defined as the range of colour types which is obtainable by mixing three colours. However, the solution of using three or more LEDs of different colours is too expensive and complex for many applications. It is therefore desirable to have available a light source which enables large gamut coverage using a single LED, which can be achieved by conversion materials which emit in a narrow band. A process for the provision of LEDs for a light source having a broad spectrum utilises phosphors which convert the short-wave LED light into light having a longer wavelength. For example, a phosphor which emits light over a broad range of green wavelengths can be excited using blue light from an LED which generates a narrow blue spectrum. The green light generated by the phosphor is then used as a component of the white light source. By combining a plurality of phosphors, a white light source having a broad spectrum can in principle be created, provided that the efficiencies of the phosphors during the light conversion are sufficiently high. This would result in improved colour reproduction properties. Further details can be found in "Status and prospects for phosphor-based white LED Packaging", Z. Liu et al., Xiaobing Front. Optoelectron. China 2009, 2(2): 119-140.

Unfortunately, however, a light designer does not have access to any desired set of phosphors from which he is able to select. There is only a limited number of conventional rare-earth element-containing phosphors which can be employed in LEDs and which have adequate efficiencies in light conversion. The emission spectrum of these phosphors cannot readily be modified. In addition, the spectra are less than ideal inasmuch as the light emitted as a function of the wavelength is not constant. Even combination of a plurality of phosphors therefore does not produce an optimum white light source. In addition, red phosphors currently used emit light deep into the long-wave red spectral region, which additionally reduces the brightness of such LEDs and thus their efficiency.

U.S. Pat. No. 7,102,152 B2, U.S. Pat. No. 7,495,383 B2 and U.S. Pat. No. 7,318,651 B2 and US patent application US 2013/0341590 A1 disclose devices and processes for the emission of light in which both semiconductor nanoparticles in the form of quantum dots (QDs) and also non-quantum fluorescent materials are utilised in order to convert at least some of the light originally emitted by a light source of the device into light having a longer wavelength. QDs have a high quantum yield and a narrow emission spectrum with a central emission wavelength which can be adjusted via the size.

WO 2017/004145 A1 describes stabilised QD structures which are suitable for use in an LED system. A combination of both QDs and conventional phosphors enables the light quality to be improved. QD additions enable improvements to be achieved, but have the disadvantage of high inherent absorption, i.e. they absorb light which is emitted when they are excited themselves. This reduces the overall energy efficiency of the light conversion. In addition, QDs, like commercially available red emitters, likewise reabsorb the green phosphor emission, which additionally results in a decrease in the energy efficiency and in addition in a shift in the emission spectrum, making targeted colour planning more difficult. In addition, separation may occur during production of LEDs when QD materials and phosphors are used, meaning that a homogeneous distribution of the light-converting materials is no longer ensured. Reduced energy efficiency and inadequate control of the desired colour reproduction are the consequence.

In some applications, clusters with tightly packed QDs are desired. Tightly packed QD clusters of this type exhibit a phenomenon which is known under the name fluorescence resonance energy transfer (FRET), see, for example, Joseph R. Lakowicz, "Principles of Fluorescence Spectroscopy", 2nd Edition, Kluwer Academic/Plenum Publishers, New York, 1999, pp. 367-443. FRET occurs between a donor QD, which emits with a shorter (for example bluer) wavelength, and an acceptor QD, which is arranged in the direct vicinity and emits with longer wavelength. A dipole-dipole interaction occurs between the dipole moment of the donor emission transition and the dipole moment of the acceptor absorption transition. The efficiency of the FRET process depends on the spectral overlap between the absorption of the donor and the emission of the acceptor. The FRET separation between quantum dots is typically 10 nm or less. The efficiency of the FRET effect is very highly dependent on the separation. FRET results in a colour change (red shift) and in efficiency losses during light conversion. For this reason, efforts were made in earlier work to avoid cluster formation of QDs in light-converting materials.

Semiconductor nanoparticles are a class of nanomaterials whose physical properties can be adjusted over a broad range by adjustment of the particle size, composition and shape. In particular, the fluorescence emission is one of the properties of this class which is dependent on the particle size. The adjustability of the fluorescence emission is based on the quantum limitation effect, according to which a reduction in the particle size results in "particle in a box" behaviour, which results in a blue shift of the band gap energy and thus in light emission. Thus, for example, the emission of CdSe nanoparticles can be adjusted from 660 nm for particles having a diameter of ~6.5 nm to 500 nm for particles having a diameter of ~2 nm. Similar behaviour can be achieved for other semiconductor nanoparticles, which results in it being possible to cover a broad spectral range from the ultraviolet (UV) region (on use of, for example, ZnSe or CdS) via the visible (VIS) region (on use of, for example, CdSe or InP) to the near infrared (NIR) region (on use of, for example, InAs). A change in the shape of the nanoparticles has already been demonstrated for a number of semiconductor systems, where, in particular, the rod shape is of importance. Nanorods have properties which differ from the properties of spherical nanoparticles. For example, they exhibit emission which is polarised along the longitudinal axis of the rod, whereas spherical nanoparticles have unpolarised emission. A further attractive property of colloidal semiconductor nanoparticles is their chemical accessibility, which allows these materials to be processed in various ways. The semiconductor nanoparticles can be applied in the form of thin layers from solution by spin coating or spray coating or embedded in plastics. Jan Ziegler et al. in "Silica-Coated InP/ZnS Nanocrystals as Converter Material in White LEDs", Advanced Materials, Vol. 20, No. 21, 13 Oct. 2008, pages 4068-4073, describe the production of white LEDs with the addition of a silicone composite layer which comprises a light-emitting conversion material on a high-performance blue LED chip.

The use of semiconductor nanoparticles in LED applications has been described, inter alia, in US 2015/0014728 A1, which relates to a phosphor/matrix composite powder which can be used in an LED. The phosphor/matrix composite powder comprises a matrix and a plurality of phosphors or quantum dots having a size of 100 nm or less which are dispersed in the matrix, where the size of the composite powder is 20 µm or more and it has a certain surface roughness. Even during its production, the composite powder described requires precise setting of the mixing ratios of the phosphors and quantum dots in order to achieve the desired emission behaviour. By contrast, subsequent adaptation of the mixing ratios is not possible, which results in restricted flexibility in the usability of the composite powder in the production of LEDs. In addition, the efficiency of the energy conversion is highly dependent on the type and amount of the phosphor materials dispersed in the matrix. In particular if the amount of the phosphors and/or quantum dots is large, it becomes difficult to sinter the material. In addition, the porosity increases, which makes efficient irradiation with excitation light more difficult and impairs the mechanical strength of the material. If, however, the amount of the phosphor materials dispersed in the matrix is too low, it becomes difficult to achieve adequate light conversion.

In view of the numerous deficiencies of the known light-conversion materials mentioned above, including the known combinations of QDs with conventional phosphors (conversion phosphors), there is a need for semiconductor nanoparticle materials and compositions which comprise such materials with conventional phosphors which do not have such deficiencies. In particular, there is a need for conversion materials having low to negligible reabsorption and having low inherent absorption, which results in higher efficiency in light conversion and in improved controllability of the gamut.

It would therefore be desirable to have available light-converting materials based on semiconductor nanoparticles which are distinguished by low reabsorption and inherent absorption and thus increase the energy efficiency of an LED. Furthermore, it would be desirable to have available light-converting materials based on semiconductor nanoparticles which are distinguished by improved miscibility with conventional phosphors, so that the disadvantages described above (for example reduced energy efficiency and inadequate control of colour reproduction) which arise owing to separation effects during LED production are avoided.

The use of quantum materials without additional excitation, as is proposed in the present invention, requires high material usage in order to achieve the desired emission spectrum. This leads to negative effects, such as the FRET described above and increased losses in efficiency due to scattering and reflection of the light at the particles in the silicone. Furthermore, owing to the toxicity on use of Cd-containing semiconductor nanoparticles, a reduction in the loading is important.

OBJECT OF THE INVENTION

The object of the present invention is therefore to provide a light-converting material based on semiconductor nanoparticles which does not have the above-described disadvantages from the prior art. In particular, it is an object of the present invention to provide a light-converting material based on semiconductor nanoparticles which has improved miscibility with conventional phosphors and consequently facilitates more efficient production of LEDs, since losses owing to separation effects during mixing are avoided. A further object of the present invention is the provision of a light-converting material based on semiconductor nanoparticles which enables increased efficiency of the LEDs and significantly reduced consumption of materials in the LEDs. It is furthermore an object of the present invention to provide a light-converting material based on semiconductor nanoparticles which is distinguished by ready processability during the production of LEDs and enables LED manufacturers to use existing equipment and machines for the production of LEDs. In addition, it is an aim of the present invention to provide a light-converting material based on semiconductor nanoparticles which enables improved and more targeted setting of the LED emission compared with conventional semiconductor nanoparticles employed in films, which allows more flexible use. A further object of the present invention is the provision of a light-converting material based on semiconductor nanoparticles which enables increased brightness of the LEDs and in addition is distinguished by narrow-band emission, meaning that energy losses in the long-wave spectral region are avoided and improved gamut coverage in displays is facilitated. On use in films, the aim of the present invention is to reduce materials consumption and thus to facilitate better efficiency. Furthermore, it should be possible to coat the light-converting material according to the invention using known coating methods which are used for the application of barrier layers in the production of phosphors, where an additional barrier layer of this type for the light-converting material is not absolutely necessary.

DESCRIPTION OF THE INVENTION

Surprisingly, it has been found that the objects described above are achieved by a light-converting material which comprises a luminescent material and at least one type of semiconductor nanoparticles which are located on the surface of the luminescent material. The luminescent material and the at least one type of semiconductor nanoparticles must be selected so that the emission from the semiconductor nanoparticles is in the region of the emission from the luminescent material. This means that both the semiconductor nanoparticles and the luminescent material emit light of similar wavelength.

For example, the semiconductor nanoparticles and the luminescent material may both emit in the violet, blue, cyan, green, yellow, orange or red spectral region. It is also possible for the semiconductor nanoparticles and the luminescent material to emit in adjacent spectral regions of different colour, such as, for example, in the violet and blue, blue and cyan, cyan and green, green and yellow, yellow and orange or orange and red spectral region.

Furthermore, it has surprisingly been found that reabsorption of the emission from luminescent materials, which normally results in losses, in this case results in an increase in the efficiency and enables significantly reduced material consumption, with retention of the advantages of the narrow-band emission by the semiconductor nanoparticles. This allows more efficient utilisation of the light-converting material and improved miscibility of the light-converting material with conventional phosphors and thus enables more economical production of efficient LEDs, which are distinguished by improved performance data, such as energy efficiency, brightness and stability.

The above-mentioned objects are thus achieved by a light-converting material which comprises a luminescent material and semiconductor nanoparticles, where the semiconductor nanoparticles are located on the surface of the luminescent material and the emission from the semiconductor nanoparticles is in the region of the emission from the luminescent material. The luminescent material ideally has high absorption in the region of the wavelength of the primary light source and efficient emission in the vicinity of the absorption by the semiconductor nanoparticles. Some of the photons emitted by the luminescent material are utilised here for additional stimulation of the emission from the semiconductor nanoparticles.

The inventors have found that semiconductor nanoparticles have improved physical properties if they are located on the surface of luminescent materials, which results in them being more suitable for combination with conventional phosphors or as phosphor substitute in lighting applications. In particular, the inventors have established that the use of the light-converting material according to the invention in light sources results in lesser self-absorption effects of the semiconductor nanoparticles with high absorption of the primary light source, which enables controlled colour setting and high efficiency. In addition, the light-converting material according to the invention suppresses fluorescence resonance energy transfer (FRET) and the associated undesired consequences. Semiconductor nanoparticles usually have very high photoluminescence self-absorption and low absorption in the desired blue or ultraviolet spectral region and must therefore be employed in high concentrations. A light-converting material of the present invention is thus distinguished by high reabsorption of the efficient emission of the luminescent material and reduced self-absorption.

In addition, a process is provided for the preparation of the light-converting material according to the invention which comprises the following steps: (A) provision of a luminescent material suspension in a solvent; and (B) addition of a semiconductor nanoparticle suspension in a solvent.

The present invention furthermore provides a light-converting mixture which comprises one or more of the light-converting materials according to the invention.

The light-converting material according to the invention and the light-converting mixture according to the invention enable the partial or complete conversion of ultraviolet and/or blue light into light having a longer wavelength, such as, for example, green or red light.

In addition, the present invention provides a light source which contains at least one primary light source and at least one light-converting material according to the invention or at least one light-converting mixture according to the invention.

The light source of the present invention can be used in a lighting unit.

In addition, the present invention provides a process for the production of the light source according to the invention, where the light-converting material according to the invention or the light-converting mixture according to the invention is applied to the primary light source or a support material in the form of a film by spin coating or spray coating or in the form of a sheet as laminate.

Preferred embodiments of the invention are described in the dependent claims.

DEFINITIONS

Figure 1:
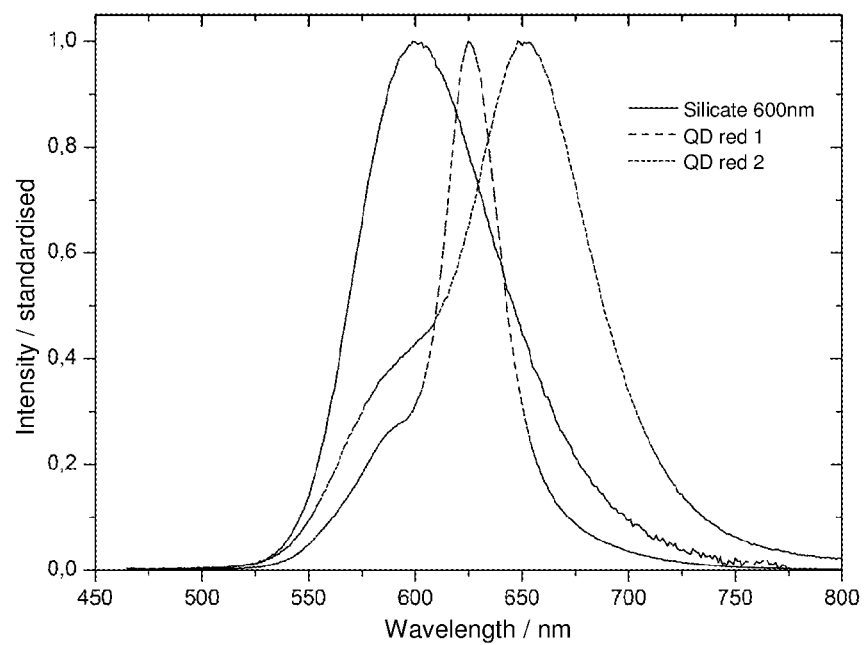
FIG. 1: Relative spectral energy distribution of the emission from the light-converting materials prepared from Examples 1 and 2 and the luminescent starting material.
Figure 2:
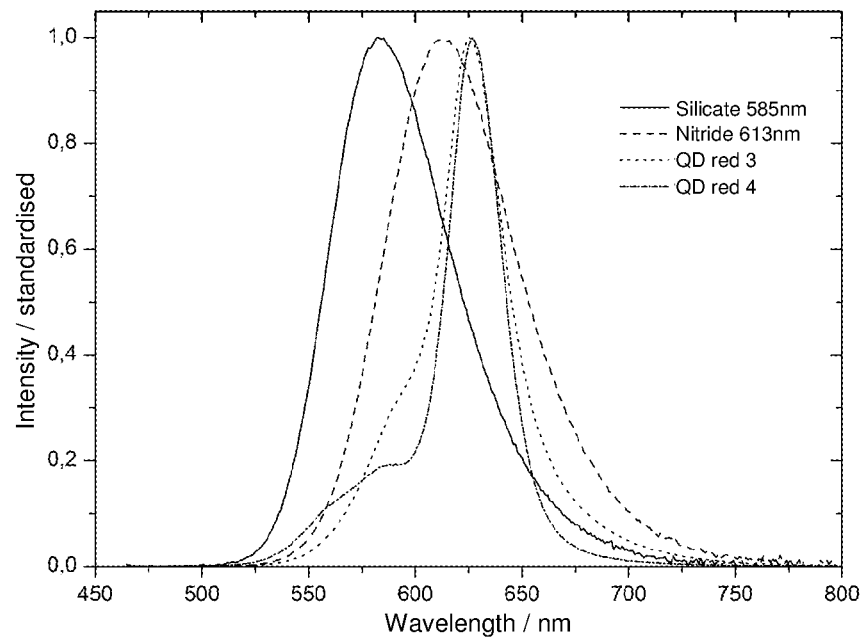
FIG. 2: Relative spectral energy distribution of the emission from the light-converting materials prepared from Examples 3 and 4 and the luminescent starting material.
Figure 3:
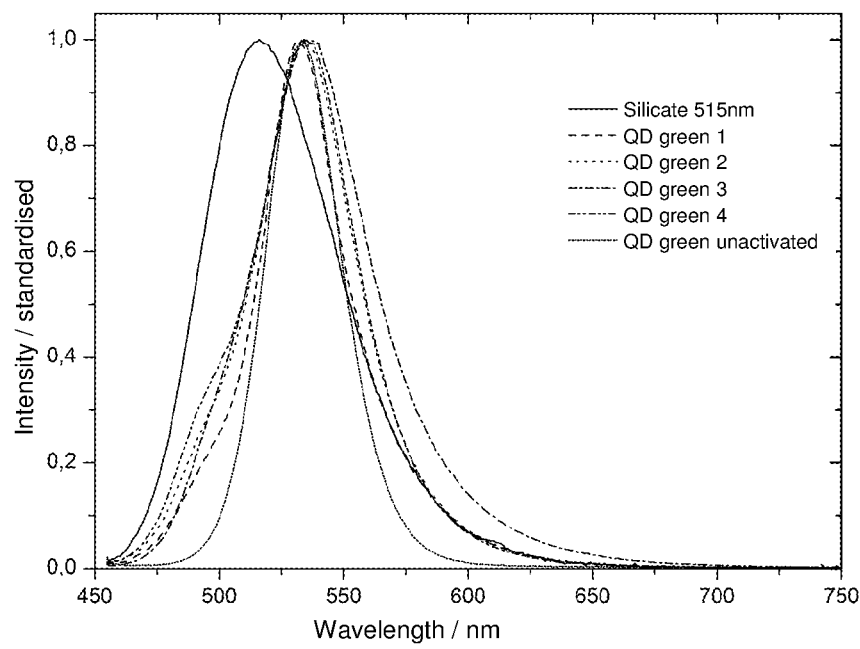
FIG. 3: Relative spectral energy distribution of the emission from the light-converting materials prepared from Examples 5 to 8 and a luminescent starting material and a light-converting material consisting of semiconductor nanoparticles and unactivated orthosilicate, which has been prepared analogously to Example 6.
Figure 4:
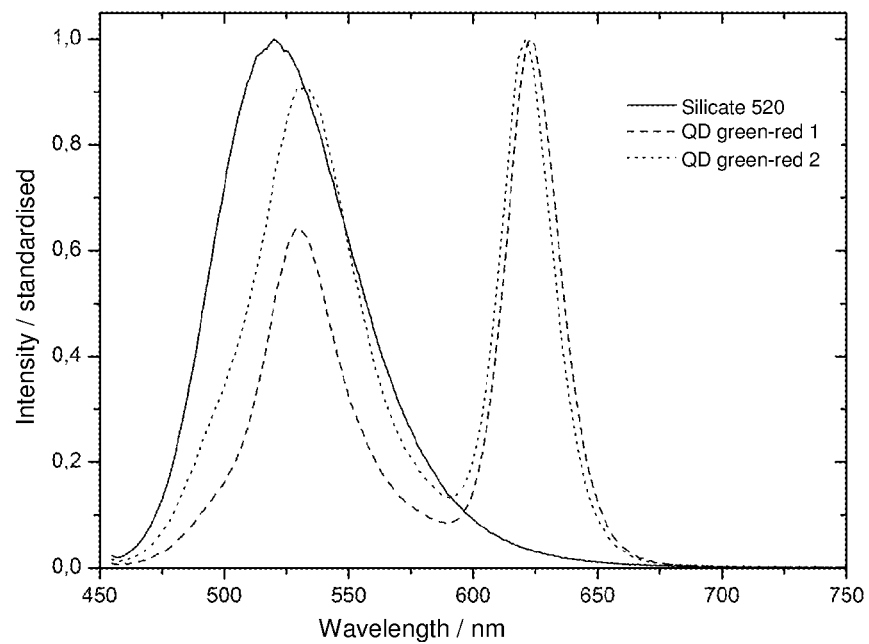
FIG. 4: Relative spectral energy distribution of the emission from the light-converting materials prepared from Examples 10 and 11 and the luminescent starting material.
Figure 5:
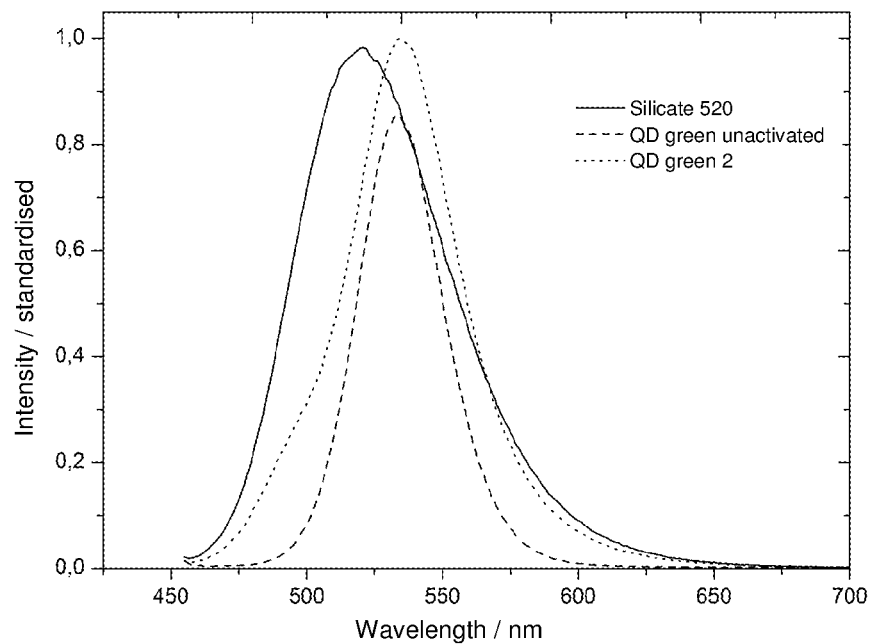
FIG. 5: Relative spectral energy distribution of the emission (standardised to the maximum of all samples) from the light-converting material prepared from Example 6 and the luminescent starting material and a light-converting material consisting of semiconductor nanoparticles and unactivated orthosilicate which has been prepared analogously.
Figure 6:
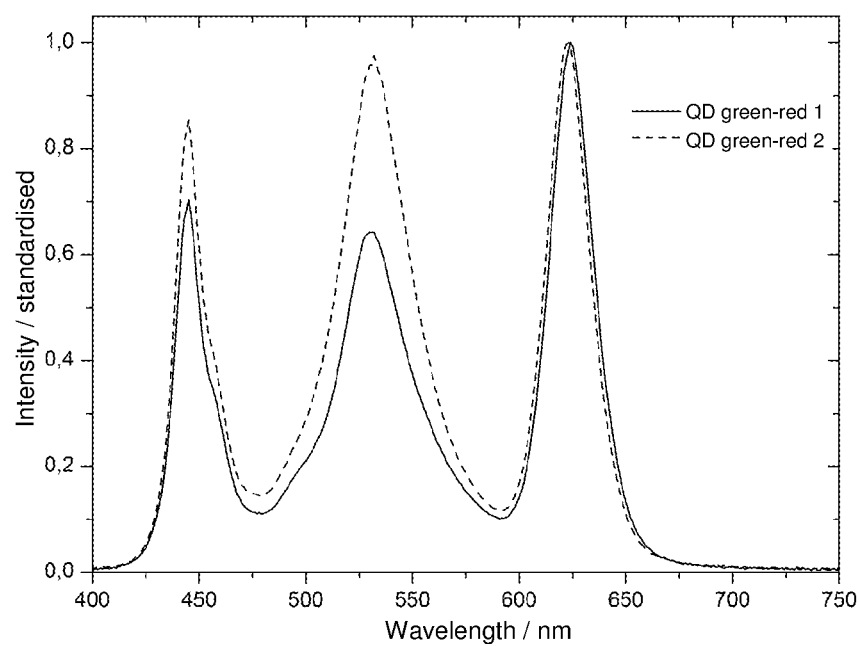
FIG. 6: Emission spectra of the LEDs produced from the light-converting materials of Examples 10 and 11 with a blue LED ($\lambda_{max}$=450 nm).

As used in the present application, the term "light-converting material" denotes a combination of a luminescent material and at least one type of semiconductor nanoparticles, where the semiconductor nanoparticles are located on the surface of the luminescent material and the emission from the nanoparticle semiconductors is in the region of the emission from the luminescent material. Besides the at least one type of semiconductor nanoparticles, the light-converting material may also comprise further types of semiconductor nanoparticles, whose emission is not necessarily in the region of the emission from the luminescent material. The further types of semiconductor nanoparticles are preferably likewise located on the surface of the luminescent material.

As used in the present application, the term "luminescent material" denotes a material in particle form which is able to convert light of a first wavelength into light of a second wavelength. The luminescent material is in the form of macroscopic particles which are not nanoparticles. The luminescent material is preferably crystalline. The luminescent material can be an upconverter, which converts light of a first wavelength into light of a second wavelength, where the light of the second wavelength is of shorter wavelength than the light of the first wavelength, or a downconverter, which converts light of a first wavelength into light of a second wavelength, where the light of the second wavelength is of longer wavelength than the light of the first wavelength. Downconverter materials typically emit light of longer wavelength (for example green or red) after excitation by short-wave (for example ultraviolet or blue) light. In a preferred embodiment, the luminescent material is a downconverter. The luminescent material should have good absorption of the light from the primary light source.

Possible luminescent materials are phosphors or conversion phosphors which comprise an inorganic matrix and at least one activator, i.e. a light-converting centre. In addition, the luminescent material may have specific self-absorption in the visible region and is consequently coloured or colourless. In a preferred embodiment, the luminescent material, as used in the present invention, is transparent. The luminescent material in the present invention serves as support material for the semiconductor nanoparticles and, besides the primary light source, as additional stimulation for the emission from the semiconductor nanoparticles. Owing to the transparency of the luminescent material, light emitted by a primary light source, the material itself, another phosphor or another light-converting material is able to pass through the material unhindered and with no losses, resulting in an increase in the efficiency of the application of the light-converting material according to the invention in an LED. In the case of an intransparent luminescent material, this should at least have high reflectivity.

As used in the present application, the terms "phosphor" or "conversion phosphor", which are used as synonyms here, denote a fluorescent inorganic material in particle form having one or more emitting centres. The emitting centres are formed by activators, usually atoms or ions of a rare-earth metal element, such as, for example, La, Ce, Pr, Nd, Pm, Sm, Eu, Gd, Tb, Dy, Ho, Er, Tm, Yb and Lu, and/or atoms or ions of a transition-metal element, such as, for example, Cr, Mn, Fe, Co, Ni, Cu, Ag, Au and Zn, and/or atoms or ions of a main-group metal element, such as, for example, Na, Tl, Sn, Pb, Sb and Bi. Examples of phosphors or conversion phosphors include aluminate-based phosphors, such as garnets, silicate-based, orthosilicate-based, phosphate-based, thiogallate-based, sulfide-based and nitride-based phosphors. Phosphor materials in the sense of the present invention have no quantum limitation effects. Non-quantum-limited phosphor materials of this type can be phosphor particles with or without silicon dioxide coating. A phosphor or conversion phosphor in the sense of the present application is taken to mean a material which absorbs radiation in a certain wavelength region of the electromagnetic spectrum, preferably in the blue or UV spectral region, and emits light in another wavelength region of the electromagnetic spectrum, preferably in the violet, blue, green, yellow, orange or red spectral region. The term "radiation-induced emission efficiency" should also be understood in this connection, i.e. the conversion phosphor absorbs radiation in a certain wavelength region and emits radiation in another wavelength region with a certain efficiency. The term "shift of the emission wavelength" is taken to mean that a conversion phosphor emits light at a different wavelength compared with another or similar conversion phosphor, i.e. shifted towards a shorter or longer wavelength.

The term "semiconductor nanoparticle" (quantum material) in the present application denotes a nanoparticle which consists of a semiconductor material. Semiconductor nanoparticles are any desired discrete units having at least one dimension in the sub-micron size, which, in some embodiments, is less than 100 nm and in some other embodiments has a size of less than one micron as the largest dimension (length). In some other embodiments, the dimension is less than 400 nm. The semiconductor nanoparticle can have any desired symmetrical or asymmetrical geometrical shape, and non-restrictive examples of possible shapes are elongate, round, elliptical, pyramidal, etc. A specific example of a semiconductor nanoparticle is an elongate nanoparticle, which is also called a nanorod and is made from a semiconducting material. Further semiconductor nanorods which can be used are those having a metal or metal-alloy region on one or both ends of the respective nanorod. Examples of such elongate semiconductor/metal nanoparticles and the production thereof are described in WO 2005/075339, the disclosure content of which is incorporated herein by way of reference. Other possible semiconductor/metal nanoparticles are shown in WO 2006134599, the disclosure content of which is incorporated herein by way of reference.

Furthermore, semiconductor nanoparticles in a core/shell configuration or a core/multishell configuration are known. These are discrete semiconductor nanoparticles which are characterised by a heterostructure, in which a "core" comprising one type of material is covered with a "shell" comprising another material. In some cases, the shell is allowed to grow on the core, which serves as "seed core". The core/shell nanoparticles are then also referred to as "seeded" nanoparticles. The expression "seed core" or "core" relates to the innermost semiconductor material present in the heterostructure. Known semiconductor nanoparticles in core/shell configuration are shown, for example, in EP 2 528 989 B1, the contents of which are incorporated into the present description in their totality by way of reference. Thus, for example, punctiform semiconductor nanoparticles are known, in which a spherical shell is arranged symmetrically around a spherical core (so-called quantum dots in quantum dots). In addition, rod-shaped semiconductor nanoparticles are known, in which a spherical core is arranged asymmetrically in an elongate rod-shaped shell (so-called quantum dots in quantum rods). The expression nanorod denotes a nanocrystal having a rod-like shape, i.e. a nanocrystal which is formed by increased growth along a first ("longitudinal") axis of the crystal, while the dimensions along the other two axes are kept very small. A nanorod has a very small diameter (typically less than 10 nm) and a length which can be in the range from about 6 nm to about 500 nm. The core typically has a virtually spherical shape. However, cores having different shapes, such as, for example, pseudopyramids, cube octahedra, rods and others, can also be used. Typical core diameters are in the range from about 1 nm to about 20 nm. In the case of symmetrical punctiform semiconductor nanoparticles in core/shell configuration (quantum dots in quantum dots), the total particle diameter $d_2$ is usually much greater than the core diameter $d_1$. The magnitude of $d_2$ compared with $d_1$ influences the optical absorption of the symmetrical punctiform semiconductor nanoparticle in core/shell configuration. As is known, a semiconductor nanoparticle in core/shell configuration may comprise further outer shells, which may provide better optical and chemical properties, such as a higher quantum yield (QY) and better durability. The semiconductor nanoparticle then has a core/multishell configuration. In the case of a rod-shaped semiconductor nanoparticle in core/multishell configuration, the length of the first shell can generally be in the range between 10 nm and 200 nm and in particular between 15 nm and 160 nm. The thicknesses of the first shell in the other two dimensions (radial axis of the rod shape) can be in the range between 1 nm and 10 nm. The thickness of the further shells can generally be in the range between 0.3 nm and 20 nm and in particular between 0.5 nm and 10 nm.

Other embodiments are, for example, nanotetrapods (as described in U.S. Pat. No. 8,062,421 B2), which comprise a core consisting of a first material and at least one arm, but typically four further arms, consisting of a second material, where the core and the arms differ in their crystal structure. Nanotetrapods of this type have a large Stokes shift.

The term "core material" denotes the material that forms the core of semiconductor nanoparticles in a core/shell configuration or core/multishell configuration. The material can be a semiconductor from groups II-VI, III-V, IV-VI or I—III-VI$_2$ or any desired combination of one or more thereof. For example, the core material can be selected from the group consisting of CdS, CdSe, CdTe, ZnS, ZnSe, ZnTe, ZnO, GaAs, GaP, GaAs, GaSb, GaN, HgS, HgSe, HgTe, InAs, InP, InSb, AlAs, AlP, AlSb, Cu$_2$S, Cu$_2$Se, CuGaS$_2$, CuGaSe$_2$, CuInS$_2$, CuInSe$_2$, Cu$_2$(InGa)S$_4$, AgInS$_2$, AgInSe$_2$, Cu$_2$(ZnSn)S$_4$, alloys thereof and mixtures thereof.

The term "shell material" relates to the semiconductor material from which the shell of a semiconductor nanoparticle having a core/shell configuration or each of the individual shells of a semiconductor nanoparticle having a core/multishell configuration is built up. The material can be a semiconductor from groups II-VI, III-V, IV-VI or I-III-VI$_2$ or any desired combination of one or more thereof. For example, the shell material can be selected from the group consisting of CdS, CdSe, CdTe, ZnS, ZnSe, ZnTe, ZnO, GaAs, GaP, GaAs, GaSb, GaN, HgS, HgSe, HgTe, InAs, InP, InSb, AlAs, AlP, AlSb, Cu$_2$S, Cu$_2$Se, CuGaS$_2$, CuGaSe$_2$, CuInS$_2$, CuInSe$_2$, Cu$_2$(InGa)S$_4$, AgInS$_2$, AgInSe$_2$, Cu$_2$(ZnSn)S$_4$, alloys thereof and mixtures thereof. Owing to the toxicity of Cd, ZnS is preferentially employed as shell material. This has the disadvantage of poor absorption in the typical range of blue LEDs around 450 nm. The additional absorption here leads to a particularly great advantage in the final application.

The term "ligand" relates to an outer surface coating of the semiconductor nanoparticles which results in a passivation effect and serves to prevent agglomeration or aggregation of the nanoparticles by overcoming the Vander-Waals forces. Ligands which can generally be used are, inter alia: phosphines and phosphine oxides, such as trioctylphosphine oxide (TOPO), trioctylphosphine (TOP) or tributylphosphine (TBP); phosphonic acids, such as dodecylphosphonic acid (DDPA), tridecylphosphonic acid (TBPA), octadecylphosphonic acid (ODPA) or hexylphosphonic acid (HPA); amines, such as dodecylamine (DDA), tetradecylamine (TDA), hexadecylamine (HDA) or octadecylamine (ODA); imines, such as polyethyleneimine (PEI); thiols, such as hexadecanethiol or hexanethiol; mercaptocarboxylic acids, such as mercaptopropionic acid or mercaptoundecanoic acid; and other acids, such as myristic acid, palmitic acid, oleic acid, caproic acid or adipic acid.

The term "coating material" denotes a material which forms a coating on the surface of the particles of the light-converting material. The term "coating" is used here in order to describe one or more layers of a material which is provided on another material and partly or completely covers the outer surface or the solvent-accessible surface of the other material. From the wording used, it goes without saying that the coating applied to each individual primary particle of the light-converting material results in the production of a multiplicity of different coated primary particles which are separate from one another, instead of a multiplicity of particles which are present or included together in the same coating material in the form of a uniform matrix. The primary particles of the light-converting material typically contain a plurality of semiconductor nanoparticles. The material of the coating (coating material) may penetrate at least partially into the inner structure of the material which has been coated, so long as the coating as barrier still provides adequate protection against external physical influences or the passage of possibly harmful substances, such as, for example, oxygen, moisture and/or free radicals. This increases the stability of the light-converting material, which results in improved durability and lifetime. In addition, the coating material in some embodiments provides the light-converting material with additional functionality, such as, for example, reduced sensitivity to heat, reduced light refraction or improved adhesion of the light-converting materials in polymers or encapsulation materials. Furthermore, unevenness on the surface of the particles of the light-converting material can be smoothed by the application of one or more coating materials. Surface smoothing of this type enables good processability of the light-converting material and reduces undesired optical scattering effects of the emitted light at the surface of the material, which results in increased efficiency.

The term "encapsulation material" relates to a light-transmitting matrix material which includes the light-converting materials according to the invention and the light-converting mixtures according to the invention. The light-transmitting matrix material can be a silicone, a polymer (which is formed from a liquid or semi-solid precursor material, such as a monomer), an epoxide, a glass or a hybrid comprising a silicone and epoxide. Specific, but non-restrictive examples of the polymers include fluorinated polymers, polyacrylamide polymers, polyacrylic acid polymers, polyacrylonitrile polymers, polyaniline polymers, polybenzophenone polymers, poly(methyl methacrylate) polymers, silicone polymers, aluminium polymers, polybisphenol polymers, polybutadiene polymers, polydimethylsiloxane polymers, polyethylene polymers, polyisobutylene polymers, polypropylene polymers, polystyrene polymers, polyvinyl polymers, polyvinylbutyral polymers or perfluorocyclobutyl polymers. Silicones may include gels, such as, for example, Dow Corning® OE-6450, elastomers, such as, for example, Dow Corning® OE-6520, Dow Corning® OE-6550, Dow Corning® OE-6630, and resins, such as, for example, Dow Corning® OE-6635, Dow Corning® OE-6665, Nusil LS-6143 and other products from Nusil, Momentive RTV615, Momentive RTV656 and many other products from other manufacturers. Furthermore, the encapsulation material can be a (poly)silazane, such as, for example, a modified organic polysilazane (MOPS) or a perhydropolysilazane (PHPS). The proportion of the light-converting material or the light-converting mixture, based on the encapsulation material, is in the range from 1 to 300% by weight, preferably in the range 3-50% by weight.

In the context of the present invention, the term "emission" describes stimulated emission or induced emission of a photon initiated by another photon. An emission spectrum is the electromagnetic spectrum emitted by atoms, molecules or materials without irradiation by electromagnetic radiation of the same frequency. Whereas discrete energy levels give rise to a line spectrum, energy bands give rise to a continuous spectrum. Both line spectrum and continuous spectrum of the emission are also referred to as "emission band" in the context of the present invention. The emission band thus describes the emission intensity measured in an emission spectrum as a function of the wavelength. The wavelength at which the emission intensity is at a maximum is referred to as "emission maximum" $\lambda_{em,max}$.

The term "absorption" in context of the present invention generally denotes the absorption of a wave or particle, such as, for example, an electromagnetic wave or a photon, in an absorbing substance or body, causing the latter to be excited into a state of higher energy. On absorption, the transmission of the wave or radiation is weakened by a substance or body.

Figure 9:
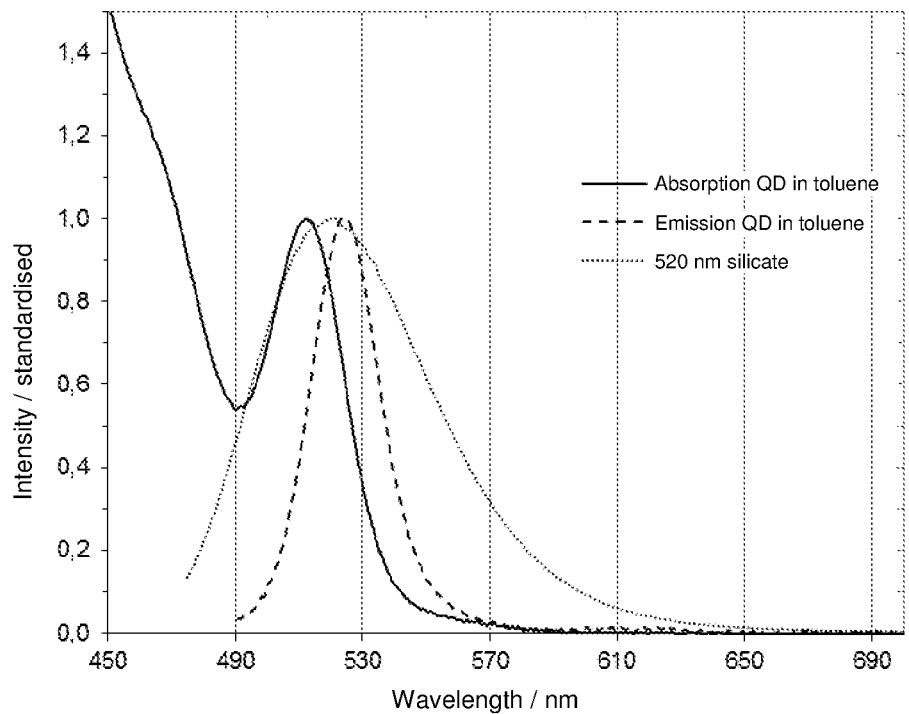
FIG. 9: Absorption and emission spectrum of the diluted toluene suspension of the semiconductor nanoparticles used in Example 5 and a silicate having peak emission at 520 nm. The core exciton absorption band has a maximum at 515 nm and the maximum of the emission is at 525 nm.

Further weakening effects as a consequence of scattering or reflection are summarized in optics together with those of absorption under the term extinction, also absorbance. For example, in the case of semiconductor nanoparticles, the absorption generally takes place via the two following mechanisms (1) and (2):

(1) Direct excitation of the allowed exciton transition in the core. This is evident in FIG. 9 as a narrow band in the absorption spectrum in the range from about 490 to 550 nm.
(2) Excitation of the band gap in the shell. This is illustrated in FIG. 9 by the absorption intensity increasing in the direction of shorter wavelengths.

The term "excitation" in the context of the present application denotes the intensity of the emission which occurs as a function of the excitation wavelength.

"Emission" denotes the physical process in which a quantum state of relatively high energy of a particle is converted into a quantum state of lower energy by emission of a photon, producing light. The frequency of the emitted light is a function of the energy of the quantum-mechanical transition. Since energy must be conserved, the energy difference between the two quantum-mechanical states is equal to the energy of the emitted photon. The energy states of the quantum-mechanical transitions can result in emissions of light having a very large frequency range. For example, visible light is emitted by coupling of electronic states in atoms and molecules. The phenomenon is then called fluorescence or phosphorescence.

An "emission spectrum" is the electromagnetic spectrum emitted by atoms, molecules or materials without irradiation by electromagnetic radiation of the same frequency. The counterpart of an emission spectrum is formed by the absorption spectrum. Whereas discrete energy levels give rise to a line spectrum, energy bands give rise to a continuous spectrum.

An "absorption spectrum" is the electromagnetic spectrum of a material which contains dark spectral lines. It arises if broad-band (white) light shines through matter, with photons of certain wavelengths or wavelength ranges being absorbed. The absorbed photons are absent in the transmitted light, which is why the spectrum is black at the wavelengths in question. If the photons are absorbed by excitation of atoms, the energy contributions and thus wavelengths are sharply defined, and the dark regions are accordingly dark lines. In molecules, by contrast, many absorbable energy values are present close to one another and form broad dark regions, so-called absorption bands, in the spectrum. The observed absorption spectrum is characteristic of the nature of the matter through which the radiation passes. Both discrete absorption lines and also absorption wavelengths lying close to one another are referred to as absorption band in the context of the present invention. An absorption band thus describes the absorption intensity measured in an absorption spectrum as a function of the wavelength.

An "exciton" is a bound electron-hole pair in an insulator or semiconductor. An exciton is able to move through the crystal while transporting its excitation energy through the latter without charge transport taking place, since the exciton is electrically neutral. Excitons have an integral spin. An exciton plays a major role in the absorption of light in semiconductors. It can be formed, for example, if a photon entersa semiconductor and excites an electron to transition from the valence band into the conduction band. The electron and the hole of opposite charge formed in the valence band attract one another through the Coulomb force. Excitons provide additional energy levels for the absorption of photons. With the aid of the Bohr atom model, some of the energy levels of the formation of excitons can be predicted for a material. These energy levels are below the band gap. In addition, excitons increase the transition probability of electrons and increase the absorption by photons that is already present in the energy region of the band gap.

In the core of the semiconductor nanoparticles, the band gap changes if the particles are smaller than twice the exciton Bohr radius and so-called quantum confinement occurs. At the same time, the band gap moves to higher energies or shorter wavelengths. Discrete energy levels arise in the conduction band and valence band, while continuous energy levels are present in the macroscopic solid. For example, a CdSe core having a size of less than 10 nm therefore only absorbs and emits electromagnetic radiation having a wavelength shorter than about 550 nm, whereas a macroscopic solid already absorbs radiation from about 700 nm. Since the shell is typically significantly larger than the core, the band gap of the macroscopic solid and conduction band as well as valence band have continuous energy levels. The band gap of the shell material is usually at a higher energy than the smallest exciton absorption energy in the core. In this case, a pronounced absorption band of the exciton transition in the core can be observed at lower energy or at longer wavelength. The absorption by the shell then begins at higher energy or shorter wavelength. This is also illustrated in the absorption spectrum in FIG. 9 (continuous line), in which the core exciton absorption is visible as a band in the range 490 to 550 nm, while the band gap absorption by the shell increases continuously below 450 nm.

The exciton Bohr radius $a_b^*$ is calculated from the following formula:

$$a_b^* = \varepsilon_r (m/\mu) a_b$$

where $\varepsilon_r$ denotes the size-dependent dielectric constant, m denotes the mass, $\mu$ denotes the reduced mass and $a_b$ denotes the Bohr radius (0.053 nm).

The wavelength at which the core exciton absorption band has its maximum is referred to as $\lambda_{ex,max}$. This is represented by the local maximum in the range 490 to 530 nm of the curve of the absorption spectrum in FIGS. 9 and 10 (continuous line).

Preferred Embodiments of the Invention

The present invention relates, as described above, to a light-converting material which comprises a luminescent material and at least one type of semiconductor nanoparticles, where the semiconductor nanoparticles are located on the surface of the luminescent material and the emission from the semiconductor nanoparticles is in the region of the emission from the luminescent material.

The emission band of the semiconductor nanoparticles and the emission band of the luminescent material preferably fully or partly overlap.

It is furthermore preferred for the emission maximum of the semiconductor nanoparticles and the emission maximum of the luminescent material to be a maximum of 50 nm apart. The following equation (1) then applies:

$$0 \text{ nm} \leq |\lambda_{em,max}(\text{semiconductor nanoparticles}) - \lambda_{em,max}(\text{luminescent material})| \leq 50 \text{ nm} \quad (1)$$

It is particularly preferred for the emission maximum of the semiconductor nanoparticles and the emission maximum of the luminescent material to be a maximum of 30 nm apart. The following equation (2) then applies:

$$0 \text{ nm} \leq |\lambda_{em,max}(\text{semiconductor nanoparticles}) - \lambda_{em,max}(\text{luminescent material})| \leq 30 \text{ nm} \quad (2)$$

It is furthermore particularly preferred for the emission maximum of the semiconductor nanoparticles and the emission maximum of the luminescent material to be a maximum of 20 nm apart. The following equation (3) then applies:

$$0 \text{ nm} \leq |\lambda_{em,max}(\text{semiconductor nanoparticles}) - \lambda_{em,max}(\text{luminescent material})| \leq 20 \text{ nm} \quad (3)$$

In a most preferred embodiment, the emission maximum of the luminescent material is shifted by up to 20 nm into the shorter-wave spectral region relative to the emission maximum of the semiconductor nanoparticles. The following equation (4) then applies:

$$0 \text{ nm} \leq \lambda_{em,max}(\text{semiconductor nanoparticles}) - \lambda_{em,max}(\text{luminescent material}) \leq 20 \text{ nm} \quad (4)$$

Emission spectra can be recorded for the present invention using any desired spectrometer that is suitable for determining the emission intensity as a function of the wavelength. The emission maximum can be determined with the aid of suitable software for the processing and evaluation of emission spectra. Suitable spectrometers are, for example, the USB 2000, HR 4000 or QE65 Pro from Ocean Optics.

In a preferred embodiment, the luminescent material and the semiconductor nanoparticles are selected so that the excitation of the semiconductor nanoparticles is in the region of the excitation of the luminescent material. This means that both the semiconductor nanoparticles and the luminescent material are excited by or absorb light having a similar wavelength. For example, the semiconductor nanoparticles and the luminescent material can both be excited in the ultraviolet, violet, blue or cyan spectral region.

The excitation band of the semiconductor nanoparticles and the excitation band of the luminescent material preferably overlap fully or partly with the emission band of the primary light source.

It is furthermore preferred for the maximum of the core exciton absorption band of the semiconductor nanoparticles and the emission maximum of the luminescent material to be a maximum of 50 nm apart. The following equation (5) then applies:

$$0 \text{ nm} \leq |\lambda_{ex,max}(\text{semiconductor nanoparticles}) - \lambda_{em,max}(\text{luminescent material})| \leq 50 \text{ nm} \quad (5)$$

It is more preferred for the maximum of the core exciton absorption band of the semiconductor nanoparticles and the emission maximum of the luminescent material to be a maximum of 30 nm apart. The following equation (6) then applies:

$$0 \text{ nm} \leq |\lambda_{ex,max}(\text{semiconductor nanoparticles}) - \lambda_{em,max}(\text{luminescent material})| \leq 30 \text{ nm} \quad (6)$$

In a most preferred embodiment, the maximum of the core exciton absorption band of the semiconductor nanoparticles and the emission maximum of the luminescent material are a maximum of 10 nm apart. The following equation (7) then applies:

$$0 \text{ nm} \leq |\lambda_{ex,max}(\text{semiconductor nanoparticles}) - \lambda_{em,max}(\text{luminescent material})| \leq 10 \text{ nm} \quad (7)$$

Absorption and emission spectra can be recorded for the present invention using any desired spectrometer that is suitable for determining the absorption intensity or emission intensity as a function of the wavelength. Absorption and emission maxima can be determined with the aid of suitable software for the processing and evaluation of spectra. Suitable spectrometers and software are known to the person skilled in the art.

Absorption spectra of semiconductor nanoparticles in suspension (for example toluene, ethanol or water) are generally measured as follows in the present invention: the adsorption is measured as a function of the wavelength compared with the pure solvent with the aid of a UV-VIS spectrometer (for example UV-2550 from Shimadzu). It must be ensured here that the absorption in the wavelength range investigated is between 30% and 100%. If the absorption is above or below this range, the suspension must be correspondingly diluted or concentrated.

Absorption spectra of luminescent materials are generally measured as follows in the present invention: a powder sample of the material prepared in a sample holder is excited stepwise using monochromatic electromagnetic radiation, and the number of emitted photons is detected by means of a photoelectron multiplier at a 90° angle to the excitation source.

Emission spectra of semiconductor nanoparticles are measured in the present invention with the aid of a Hamamatsu Photonics C9920-02 measurement system and the procedure specified by the manufacturer. The absorption of the suspension at the selected excitation wavelength should be in the range from 15% to 40%. This is achieved by adjustment of the concentration in the respective solvent.

In the case of band emission of the luminescent material, it is preferred for the emission band of the luminescent material to overlap fully or partly with the core exciton absorption band of the semiconductor nanoparticles.

Figure 10:
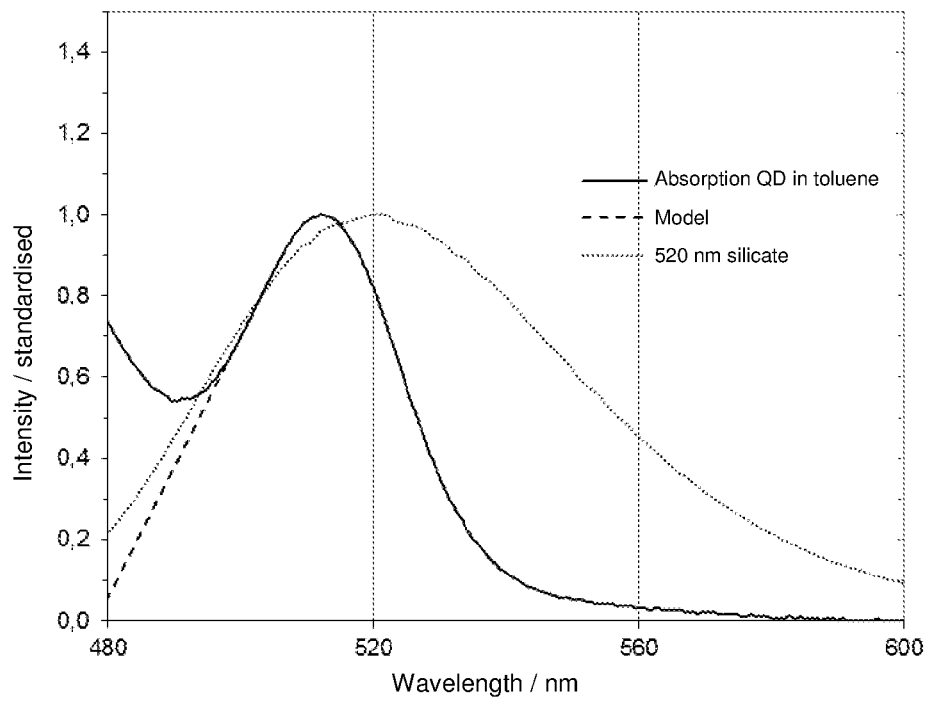
FIG. 10: Absorption spectrum of the diluted toluene suspension of the semiconductor nanoparticles used in Example 5 and modelled core exciton absorption band and emission spectrum of a silicate having peak emission at 520 nm. The core exciton absorption band has a maximum at 515 nm and the maximum of the emission is at 525 nm.

The overlap of the bands is determined using the standardised emission or absorption spectra, from which the overlapping area AOL of the emission band of the luminescent material and the core exciton absorption band of the semiconductor nanoparticles is determined. The ratio of the overlapping areas AOL to the total area of the core exciton excitation band $A_{ex}$ of the semiconductor nanoparticles is subsequently formed: $A_{OL}/A_{ex}$. The total area $A_{ex}$ is obtained by modelling the core exciton absorption band, as shown in FIG. 10.

It is preferred for the overlap $A_{OL}$ between the emission band of the luminescent material and the core exciton absorption band of the semiconductor particles to be at least 50%, based on the total area of the core exciton excitation band $A_{ex}$. The following equation (8) then applies:

$$A_{OL}/A_{ex}*100\% > 50\% \quad (8)$$

The overlap is more preferably at least 80%. The following equation (9) then applies:

$$A_{OL}/A_{ex}*100\% > 80\% \quad (9)$$

FIGS. 9 and 10 show an example in which the overlap is at least 80%.

In the case of line emission of the luminescent material, the emission band having the maximum intensity (emission maximum $\lambda_{em,max}$) of the luminescent material and the maximum of the core exciton absorption band ($\lambda_{ex,max}$) of the semiconductor nanoparticles are preferably a maximum of 50 nm apart. Equation (5) then applies. The emission maximum $\lambda_{em,max}$ of the luminescent material and the maximum of the core exciton absorption band $\lambda_{ex,max}$ of the semiconductor nanoparticles are particularly preferably between 0 and 30 nm apart. Equation (6) then applies. The maximum of the core exciton absorption band $\lambda_{ex,max}$ of the semiconductor nanoparticles and the emission maximum $\lambda_{em,max}$ of the luminescent material are most preferably a maximum of 10 nm apart. Equation (7) then applies. FIG. 9 shows an example in which the conditions of equations (5) to (9) are satisfied.

The resultant light-converting material of the present invention can be in the form of loose material, powder material, thick or thin layer material or self-supporting material in the form of a film. Furthermore, it may be embedded in an encapsulation material. The light-converting material may comprise added materials, such as, for example, ligands and/or coating materials.

The luminescent material used in the light-converting material is coloured or colourless and preferably transparent. Light emitted by a primary light source or by another luminescent material can be absorbed by the luminescent material used and light reaching the semiconductor nanoparticles on the surface of the luminescent material used can be absorbed thereby and converted into light having the same or a longer wavelength and emitted, increasing the efficiency of the LED on use of the light-converting material according to the invention.

Alternatively, in the case of the use of a transparent luminescent material, the light from a primary light source or from another luminescent material can pass through the luminescent material used unhindered and without losses and reach the semiconductor nanoparticles on the surface, by which it is absorbed, converted into light having a longer wavelength and then emitted, increasing the efficiency on use of the light-converting material according to the invention in an LED.

In the present invention, the luminescent material serves as support material and at the same time ensures more efficient excitation of the semiconductor nanoparticles located on the surface of the luminescent material. The semiconductor nanoparticles can be distributed randomly or in a defined arrangement on the surface of the luminescent material.

In a preferred embodiment of the present invention, the proportion by weight of the semiconductor nanoparticles located on the surface of the luminescent material is in the range from 0.1 to 5% by weight, based on the total weight of the light-converting material.

The luminescent material in the present invention is not restricted with respect to the chemical composition. Suitable luminescent materials are, for example, inorganic phosphors which contain activators, i.e. emitting centres. Inorganic phosphors of this type are luminescent in the sense of the present invention, since they exhibit specific self-absorption and convert short-wave light. They are therefore suitable as support materials for the semiconductor nanoparticles.

In a preferred embodiment of the present invention, the luminescent material is an inorganic phosphor selected from the group comprising luminescent metal oxides, silicates and halosilicates, phosphates and halophosphates, borates, haloborates and borosilicates, aluminates, gallates and alumosilicates, molybdates and tungstates, sulfates, sulfides, selenides and tellurides, nitrides and oxynitrides, SiAlONs, complex metal-oxygen compounds, halogen compounds and oxy compounds, such as, preferably, oxysulfides or oxychlorides. The compounds are typically activated by metals selected from the list consisting of Eu, Ce, Mn, Tb, Sm, Cr, Sn, Pb, Sb, Bi, Cu and Ag or mixtures thereof. Particularly preferred activators are Eu(II), Ce(III), Mn(II), Mn(IV), Eu(III), Tb(III), Sm(III), Cr(III), Sn(II), Pb(II), Sb(III), Bi(III), Cu(I) and Ag(I) and mixtures thereof.

Preferred luminescent complex metal-oxygen compounds are luminescent antimonates, luminescent arsenates, luminescent germanates, luminescent hafnates, luminescent halogermanates, luminescent indates, luminescent lanthanates, luminescent niobates, luminescent scandates, luminescent stannates, luminescent tantalates, luminescent titanates, luminescent vanadates, luminescent halovanadates, luminescent phosphovanadates, luminescent yttrates and luminescent zirconates.

Examples of luminescent metal oxides include: $M^{2+}O:D$, $M^{3+}_2O_3:D$ and $M^{4+}O_2:D$, in which $M^{2+}$ is Zn, Fe, Co, Ni, Cd, Cu and/or one or more alkaline-earth metals, preferably Be, Mg, Ca, Sr and/or Ba; $M^{3+}$ is Al, Ga, Sc, Y, La and/or one or more rare-earth metals selected from Sc, Y, La, Ce, Pr, Nd, Pm, Sm, Eu, Gd, Tb, Dy, Ho, Er, Tm, Yb and Lu; $M^{4+}$ is Ti, Zr, Ge, Sn and/or Th; and D is one or more activators selected from the list consisting of Eu, Ce, Mn, Tb, Sm, Cr, Sn, Pb, Sb, Bi, Cu and Ag.

Preferred examples of luminescent metal oxides are: $Al_2O_3:D$, $CaO:D$, $Ga_2O_3:D$, $La_2O_3:D$, $ThO_2:D$, $Y_2O_3:D$, $ZnO:D$, $(Y,Gd)_2O_3:D$ and $(Zn,Cd)O:D$.

Examples of luminescent silicates or halosilicates include: $M^{2+}SiO_3:D$, $M^{2+}_2SiO_4:D$, $M^{2+}_2(Si,Ge)O_4:D$, $M^{2+}_3SiO_5:D$, $M^{3+}_2SiO_5:D$, $M^{3+}M^+SiO_4:D$, $M^{2+}Si_2O_5:D$, $M^{2+}_2Si_2O_6:D$, $M^{2+}_3Si_2O_7:D$, $M^{2+}_2M^+_2Si_2O_7:D$, $M^{3+}_2Si_2O_7:D$, $M^{2+}_4Si_2O_8:D$, $M^{2+}_2Si_3O_8:D$, $M^{2+}_3M^{3+}_2Si_3O_{12}:D$, $M^+M^{3+}M^{2+}_4Si_{4O19}:D$, $M^+M^{2+}_4M^{3+}Si_4O_{14}:D$, $M^{2+}_3M^{3+}_2Si_6O_{18}:D$, $M^{3+}SiO_3X:D$, $M^{2+}_3SiO_4X_2$: D, $M^{2+}_5SiO_4X_6:D$, $M^+_2M^{2+}_2Si_4O_{19}X_2:D$, $M^{2+}_5Si_4O_{19}X_6$: D, $M^+_2SiX_6:D$, $M^{2+}_3SiO_3X_4$ and $M^{2+}_9(SiO_4)_4X_2:D$, in which $M^+$ is one or more alkali metals, preferably Li, Na and/or K; $M^{2+}$ is Zn, Fe, Co, Ni, Cd, Cu and/or one or more alkaline-earth metals, preferably Be, Mg, Ca, Sr and/or Ba; $M^{3+}$ is Al, Sc, Y, La and/or one or more rare-earth metals selected from Sc, Y, La, Ce, Pr, Nd, Pm, Sm, Eu, Gd, Tb, Dy, Ho, Er, Tm, Yb and Lu; X is one or more halogens, preferably F, Cl, Br and/or I; and D is one or more activators selected from the list consisting of Eu, Ce, Mn, Tb, Sm, Cr, Sn, Pb, Sb, Bi, Cu and Ag.

Preferred examples of luminescent silicates and halosilicates are: $Ba_2(Mg,Sr)Si_2O_7:D$, $Ba_2SiO_4:D$, $(Ba,Sr)_2SiO_4:D$, $Ba_5SiO_4Br_6:D$, $BaSi_2O_5:D$, $BaSrMgSi_2O_7:D$, $Be_2SiO_4:D$, $Ca_2MgSi_2O_7:D$, $Ca_3MgSi_2O_8:D$, $Ca_3SiO_4Cl_2:D$, $CaMgSi_2O_6:D$, $CaSiO_3:D$, $(Ca,Mg)SiO_3:D$, $(Ca,Sr)_2SiO_4$: D, $(Ba,Sr)_3SiO_5:D$, $(Ca,Sr)_3SiO_5:D$, $Gd_2SiO_5:D$, $K_2SiF_6:D$, $LaSiO_3Cl:D$, $LiCeBa_4Si_4O_{14}:D$, $LiCeSrBa_3Si_4O_{14}:D$, $LiNa(Mg,Mn)_2Si_4O_{10}F_2:D$, $Lu_2Si_2O_7:D$, $Lu_2SiO_5:D$, $(Lu,Gd)_2SiO_5:D$, $Mg_2SiO_4:D$, $Mg_3SiO_3F_4:D$, $MgBa_3Si_2O_8$: D, $MgSiO_3:D$, $MgSr_3Si_2O_8:D$, $MgSrSi_2O_7:D$, $Sr_2SiO_4:D$, $Sr_3Gd_2Si_6O_{18}:D$, $Sr_5Si_4O_{19}Cl_6:D$, $SrBaSiO_4:D$, $SrMgSi_2O_6:D$, $Y_2Si_2O_7:D$, $Y_2SiO_5:D$, $Zn_2(Si,Ge)O_4:D$, $Zn_2SiO_4:D$ and $(Zn,Be)_2SiO_4:D$.

Examples of luminescent phosphates or halophosphates include:

$M^{3+}PO_4:D$, $M^{2+}P_2O_6:D$, $M^{2+}_2P_2O_7:D$, $M^+_2M^{2+}P_2O_7:D$, $M^{4+}P_2O_7:D$, $M^{2+}B_2P_2O_9:D$, $M^{2+}_6BP_5O_{20}:D$, $M^{2+}_3(PO_4)_2$: D, $M^+_3M^{3+}(PO_4)_2:D$, $M^{2+}_6(PO_4)_4:D$ and $M^{2+}_5(PO_4)_3X:D$, in which $M^+$ is one or more alkali metals, preferably Li, Na and/or K; $M^{2+}$ is Zn, Fe, Co, Ni, Cd, Cu and/or one or more alkaline-earth metals, preferably Be, Mg, Ca, Sr and/or Ba; $M^{3+}$ is Al, Sc, Y, La and/or one or more rare-earth metals selected from Sc, Y, La, Ce, Pr, Nd, Pm, Sm, Eu, Gd, Tb, Dy, Ho, Er, Tm, Yb and Lu; $M^{4+}$ is Ti, Zr, Ge and/or Sn; X is one or more halogens, preferably F, Cl, Br and/or I; and D is one or more activators selected from the list consisting of Eu, Ce, Mn, Tb, Sm, Cr, Sn, Pb, Sb, Bi, Cu and Ag.

Preferred examples of luminescent phosphates and halophosphates are:

$Ba_3(PO_4)_2:D$, $Ca_2Ba_3(PO_4)_3Cl:D$, $Ca_2P_2O_7:D$, $Ca_3(PO_4)_2:D$, $(Ca,Sr)_3(PO_4)_2:D$, $(Ca,Zn,Mg)_3(PO_4)_2:D$, $Ca_5(PO_4)_3(F,Cl):D$, $Ca_5(PO_4)_3Cl:D$, $Ca_5(PO_4)_3F:D$, $CaB_2P_2O_9$: D, $CaP_2O_6:D$, $CaSr_2(PO_4)_2:D$, $LaPO_4:D$, $(La,Ce,Tb)PO_4:D$, $Li_2CaP_2O_7:D$, $LuPO_4:D$, $Mg_3Ca_3(PO_4)_4:D$, $MgBa_2(PO_4)_2$: D, $MgBaP_2O_7:D$, $MgCaP_2O_7:D$, $MgSr_5(PO_4)_4:D$, $MgSrP_2O_7:D$, $Na_3Ce(PO_4)_2:D$, $Sr_2P_2O_7:D$, $Sr_3(PO_4)_2:D$, $Sr_5(PO_4)_3Cl:D$, $Sr_5(PO_4)_3F:D$, $Sr_6BP_5O_{20}:D$, $YPO_4:D$, $Zn_3(PO_4)_2:D$, $Zn_3(PO_4)_2:D$, $ZnMg_2(PO_4)_2:D$ and $(Zn, Mg)_3(PO_4)_2:D$.

Examples of luminescent borates, haloborates or borosilicates include:

$M^{3+}BO_3:D$, $M^{2+}B_2O_4:D$, $M^{2+}_2B_2O_5:D$, $M^{3+}_2B_2O_6:D$, $M^{3+}B_3O_6:D$, $M^{2+}B_6O_{10}:D$, $M^{2+}M^{3+}BO_4:D$, $M^{2+}M^{3+}B_3O_7$: D, $M^{2+}B_4O_7:D$, $M^{2+}_3M^{3+}_2B_4O_{12}:D$, $M^{3+}_4B_4O_{12}:D$, $M^{3+}M^{2+}B_5O_{10}:D$, $M^{2+}_2B_6O_{11}:D$, $M^{2+}B_8O_{13}:D$, $M^{2+}_2B_5O_9X:D$, $M^{2+}_2M^{3+}_2BO_{6.5}:D$ and $M^{2+}_5B_2SiO_{10}:D$, in which $M^{2+}$ is Zn, Fe, Co, Ni, Cd, Cu and/or one or more alkaline-earth metals, preferably Be, Mg, Ca, Sr and/or Ba; $M^{3+}$ is Al, Ga, In, Sc, Y, La and/or one or more rare-earth metals selected from Sc, Y, La, Ce, Pr, Nd, Pm, Sm, Eu, Gd, Tb, Dy, Ho, Er, Tm, Yb and Lu; X is one or more halogens, preferably F, Cl, Br and/or I; and D is one or more activators selected from the list consisting of Eu, Ce, Mn, Tb, Sm, Cr, Sn, Pb, Sb, Bi, Cu and Ag.

Preferred examples of luminescent borates and borosilicates are: $Ca_2B_2O_5:D$, $Ca_2B_5O_9Br:D$, $Ca_2B_5O_9Cl:D$, $Ca_2La_2BO_{6.5}:D$, $Ca_5B_2SiO_{10}:D$, $CaB_2O_4:D$, $CaLaB_3O_7:D$, $CaLaBO_4:D$, $CaYBO_4:D$, $Cd_2B_6O_{11}:D$, $GdMgB_5O_{10}:D$, $InBO_3:D$, $LaAl_3B_4O_{12}:D$, $LaAlB_2O_6:D$, $LaB_3O_6:D$, $LaBO_3$: D, $MgB_2O_4:D$, $MgYBO_4:D$, $ScBO_3:D$, $Sr_2B_5O_9Cl:D$, $SrB_4O_7:D$, $SrB_8O_{13}:D$, $YAl_3B_4O_{12}:D$, $YBO_3:D$, $(Y,Gd)BO_3:D$ and $ZnB_2O_4, SrO:D.3B_2O_3$.

Examples of luminescent aluminates, gallates or alumosilicates include:

$M^+AlO_2:D$, $M^{3+}AlO_3:D$, $M^{2+}M^{3+}AlO_4:D$, $M^{2+}Al_2O_4:D$, $M^{2+}Al_4O_7:D$, $M^+Al_6O_8:D$, $M^{3+}_4Al_2O_9:D$, $M^{3+}_3Al_5O_{12}:D$, $M^+Al_{11}O_{17}:D$, $M^{2+}_2Al_{10}O_{17}:D$, $M^{3+}_3Al_5O_{12}:D$, $M^{3+}_3(Al,Ga)_5O_{12}:D$, $M^{3+}_3Sc_2Al_3O_{12}:D$, $M^{2+}Al_6O_{11}:D$, $M^{2+}Al_8O_{13}$: D, $M^{2+}M^{3+}Al_{11}O_{19}:D$, $M^{2+}Al_{12}O_{19}:D$, $M^{2+}_4Al_{14}O_{25}:D$, $M^{2+}_3Al_{16}O_{27}:D$, $M^{2+}Ga_2O_4:D$, $M^{2+}Ga_4O_7:D$, $M^{3+}_3Ga_5O_{12}$: D, $M^+Ga_{11}O_{17}:D$, $M^{2+}Ga_{12}O_{19}:D$, $M^+_2M^{2+}_3Al_2Si_2O_{10}:D$ and $M^{2+}_3Al_2Si_3O_{12}:D$, in which $M^+$ is one or more alkali metals, preferably Li, Na and/or K; $M^{2+}$ is Zn, Fe, Co, Ni, Cd, Cu and/or one or more alkaline-earth metals, preferably Be, Mg, Ca, Sr and/or Ba; $M^{3+}$ is Al, Sc, Y, La and/or one or more rare-earth metals selected from Sc, Y, La, Ce, Pr, Nd, Pm, Sm, Eu, Gd, Tb, Dy, Ho, Er, Tm, Yb and Lu; and D is one or more activators selected from the list consisting of Eu, Ce, Mn, Tb, Sm, Cr, Sn, Pb, Sb, Bi, Cu and Ag.

Preferred examples of luminescent aluminates, gallates and alumosilicates are: $BaAl_{12}O_{19}$:D, $BaAl_8O_{13}$:D, $BaMgAl_{10}O_{17}$:D, $CaAl_2O_4$:D, $CaAl_4O_7$:D, $(Ca,Ba)Al_{12}O_{19}$:D, $CaGa_2O_4$:D, $CaGa_4O_7$:D, $CeMgAl_{11}O_{19}$:D, $Gd_3Ga_5O_{12}$:D, $Gd_3Sc_2Al_3O_{12}$:D, $GdAlO_3$:D, $KAl_{11}O_{17}$:D, $KGa_{11}O_{17}$:D, $LaAlO_3$:D, $LaMgAl_{11}O_{19}$:D, $LiAl_5O_8$:D, $LiAlO_2$:D, $LiAlO_2$:D, $Lu_3Al_5O_{12}$:D, $LuAlO_3$:D, $(Lu,Y)AlO_3$:D, $MgAl_2O_4$:D, $MgGa_2O_4$:D, $MgSrAl_{10}O_{17}$:D, $Sr_2Al_6O_{11}$:D, $Sr_4Al_{14}O_{26}$:D, $SrAl_{12}O_{19}$:D, $SrAl_2O_4$:D, $SrAl_4O_7$:D, $SrGa_{12}O_{19}$:D, $SrGa_2O_4$:D, $Tb_3Al_5O_{12}$:D, $Y_3(Al,Ga)_5O_{12}$:D, $(Y,Gd)_3Al_5O_{12}$:D, $Y_3Al_5O_{12}$:D, $Y_4Al_2O_9$:D, $YAlO_3$:D, $ZnAl_2O_4$:D and $ZnGa_2O_4$:D.

Examples of luminescent molybdates or tungstates include: $M^{2+}MoO_4$, $M^+M^{3+}Mo_2O_8$, $M^{2+}WO_4$, $M^{2+}_3WO_6$, $M^{3+}_2W_3O_{12}$, $M^+M^{3+}W_2O_8$, in which $M^+$ is one or more alkali metals, preferably Li, Na and/or K; $M^{2+}$ is Zn, Fe, Co, Ni, Cd, Cu and/or one or more alkaline-earth metals, preferably Be, Mg, Ca, Sr and/or Ba; $M^{3+}$ is Al, Sc, Y, La and/or one or more rare-earth metals selected from Sc, Y, La, Ce, Pr, Nd, Pm, Sm, Eu, Gd, Tb, Dy, Ho, Er, Tm, Yb and Lu; X is one or more halogens, preferably F, Cl, Br and/or I; and D is one or more activators selected from the list consisting of Eu, Ce, Mn, Tb, Sm, Cr, Sn, Pb, Sb, Bi, Cu and Ag.

Preferred examples of luminescent molybdates and tungstates are:

$Ba_3WO_6$:D, $Ca_3WO_6$:D, $CaMoO_4$:D, $CaWO_4$:D, $CdWO_4$:D, $La_2W_3O_{12}$:D, $LiEuMo_2O_8$:D, $MgWO_4$:D, $Sr_3WO_6$:D, $SrMoO_4$:D, $Y_2W_3O_{12}$:D and $ZnWO_4$:D.

Examples of luminescent sulfates, sulfides, selenides or tellurides include:

$M^{2+}SO_4$:D, $M^{2+}_2(SO_4)_2$:D, $M^{2+}_3(SO_4)_3$:D, $M^{3+}_2(SO_4)_3$:D, $M^{2+}S$:D, $M^{2+}(S,Te)$:D, $M^{2+}Se$:D, $M^{2+}Te$:D, $M^{2+}Ga_2S_4$:D, $M^{2+}Ba_2S_3$:D and $M^{2+}Al_2S_4$:D, in which $M^{2+}$ is Zn, Fe, Co, Ni, Cd, Cu and/or one or more alkaline-earth metals, preferably Be, Mg, Ca, Sr and/or Ba; $M^{3+}$ is Al, Sc, Y, La, and/or one or more rare-earth metals selected from Sc, Y, La, Ce, Pr, Nd, Pm, Sm, Eu, Gd, Tb, Dy, Ho, Er, Tm, Yb and Lu; and D is one or more activators selected from the list consisting of Eu, Ce, Mn, Tb, Sm, Cr, Sn, Pb, Sb, Bi, Cu and Ag.

Preferred examples of luminescent sulfates, sulfides, selenides and tellurides are: $CaGa_2S_4$:D, $CaS$:D, $CaSO_4$:D, $CdS$:D, $Mg_2Ca(SO_4)_3$:D, $Mg_2Sr(SO_4)_3$:D, $MgBa(SO_4)_2$:D, $MgS$:D, $MgSO_4$:D, $SrAl_2S_4$:D, $SrGa_2S_4$:D, $SrS$:D, $SrSO_4$:D, $Zn(S,Te)$:D, $ZnBa_2S_3$:D, $ZnGa_2S_4$:D, $ZnS$:D, $(Zn,Cd)S$:D and $ZnSe$:D.

Examples of luminescent nitrides, oxynitrides or SiAlONs include $M^{3+}N$:D, $M^{2+}Si_2O_2N_2$:D, $M^{2+}_2Si_5N_8$:D, $M^{3+}_3Si_6N_{11}$:D, $M^{2+}AlSiN_3$:D, α-SiAlON:D and β-SiAlON:D, in which $M^{2+}$ is Zn, Fe, Co, Ni, Cd, Cu and/or one or more alkaline-earth metals, preferably Be, Mg, Ca, Sr and/or Ba; $M^{3+}$ is Al, Ga, Sc, Y, La and/or one or more rare-earth metals selected from Sc, Y, La, Ce, Pr, Nd, Pm, Sm, Eu, Gd, Tb, Dy, Ho, Er, Tm, Yb and Lu; and D is one or more activators selected from the list consisting of Eu, Ce, Mn, Tb, Sm, Cr, Sn, Pb, Sb, Bi, Cu and Ag.

Preferred examples of luminescent nitrides and oxynitrides are: $Ba_2Si_6N_8$:D, $Ca_2Si_5N_8$:D, $CaAlSiN_3$:D, $(Ca,Sr)AlSiN_3$:D, $GaN$:D, $La_3Si_6N_{11}$:D, $Sr_2Si_5N_8$:D and $(Sr,Ba)Si_2N_2O_2$:D.

Examples of luminescent complex metal-oxygen compounds include:

$M^{3+}AsO_4$:D, $M^{2+}_{13}As_2O_{18}$:D, $M^{2+}GeO_3$:D, $M^{2+}_2GeO_4$:D, $M^{2+}_4GeO_6$:D, $M^{2+}_4(Ge,Sn)O_6$:D, $M^{2+}_2Ge_2O_6$:D, $M^{3+}_4Ge_3O_{12}$:D, $M^{2+}_5GeO_4X_6$:D, $M^{2+}_8Ge_2O_{11}X_2$:D, $M^+InO_2$:D, $M^{2+}In_2O_4$:D, $M^+LaO_2$:D, $M^{2+}La_4O_7$:D, $M^{3+}NbO_4$:D, $M^{2+}Sc_2O_4$:D, $M^{2+}_2SnO_4$:D, $M^{3+}TaO_4$:D, $M^{2+}TiO_3$:D, $M^{2+}_2TiO_4$:D, $M^+_2M^{3+}_2Ti_3O_{10}$:D, $M^{2+}_5(VO_4)_3X$:D, $M^{3+}VO_4$:D, $M^{3+}(V,P)O_4$:D, $M^+YO_2$:D, $M^{2+}ZrO_3$:D, $M^{2+}_2ZrO_4$:D and $M^{2+}M^{3+}_2ZrO_6$:D, in which $M^+$ is one or more alkali metals, preferably Li, Na and/or K; $M^{2+}$ is Zn, Fe, Co, Ni, Cd, Cu and/or one or more alkaline-earth metals, preferably Be, Mg, Ca, Sr and/or Ba; $M^{3+}$ is Al, Sc, Y, La, Bi and/or one or more rare-earth metals selected from Sc, Y, La, Ce, Pr, Nd, Pm, Sm, Eu, Gd, Tb, Dy, Ho, Er, Tm, Yb and Lu; $M^{4+}$ is Ti, Zr, Ge and/or Sn; X is one or more halogens, preferably F, Cl, Br and/or I; and D is one or more activators selected from the list consisting of Eu, Ce, Mn, Tb, Sm, Cr, Sn, Pb, Sb, Bi, Cu and Ag.

Preferred examples of luminescent complex metal-oxygen compounds are:

$Ba_5GeO_4Br_6$:D, $Bi_4Ge_3O_{12}$:D, $Ca_6(VO_4)_3Cl$:D, $CaGeO_3$:D, $CaLa_4O_7$:D, $CaSc_2O_4$:D, $CaTiO_3$:D, $CaY_2ZrO_6$:D, $GdNbO_4$:D, $GdTaO_4$:D, $K_2La_2Ti_3O_{10}$:D, $LaAsO_4$:D, $LaVO_4$:D, $LiInO_2$:D, $LiLaO_2$:D, $LuTaO_4$:D, $Mg_{13}As_2O_{18}$:D, $Mg_2SnO_4$:D, $Mg_2TiO_4$:D, $Mg_4(Ge,Sn)O_6$:D, $Mg_4GeO_6$:D, $Mg_8Ge_2O_{11}F_2$:D, $NaYO_2$:D, $SrTiO_3$:D, $Y(V,P)O_4$:D, $YAsO_4$:D, $YTaO_4$:D, $YVO_4$:D and $Zn_2GeO_4$:D.

Examples of luminescent halogen or oxy compounds include: $M^+X$:D, $M^{2+}X_2$:D, $M^{3+}X_3$:D, $M^+M^{2+}X_3$:D, $M^+M^{3+}X_4$:D, $M^{2+}M^{3+}_2X_8$:D, $M^+M^{3+}_3X_{10}$:D, $M^{3+}OX$:D, $M^{2+}_8M^{4+}_2O_{11}X_2$:D and $M^{3+}_2O_2S$:D, in which $M^+$ is one or more alkali metals, preferably Li, Na and/or K; $M^{2+}$ is Zn, Fe, Co, Ni, Cd, Cu and/or one or more alkaline-earth metals, preferably Be, Mg, Ca, Sr and/or Ba; $M^{3+}$ is Al, Sc, Y, La, and/or one or more rare-earth metals selected from Sc, Y, La, Ce, Pr, Nd, Pm, Sm, Eu, Gd, Tb, Dy, Ho, Er, Tm, Yb and Lu; X is one or more halogens, preferably F, Cl, Br and/or I; and D is one or more activators selected from the list consisting of Eu, Ce, Mn, Tb, Sm, Cr, Sn, Pb, Sb, Bi, Cu and Ag.

Preferred examples of luminescent halogen compounds are: $BaBr_2$:D, $BaCl_2$:D, $BaF_2$:D, $(Ba,Sr)F_2$:D, $BaFBr$:D, $BaFCl$:D, $BaY_2F_8$:D, $CaBr_2$ in $SiO_2$:D, $CaCl_2$ in $SiO_2$:D, $CaF_2$:D, $CaI_2$ in $SiO_2$:D, $CeF_3$:D, $CsF$:D, $CsI$:D, $KMgF_3$:D, $KY_3F_{10}$:D, $LaBr_3$:D, $LaCl_3$:D, $LaF_3$:D, $LiAlF_4$:D, $LiYF_4$:D, $MgF_2$:D, $NaI$:D, $NaYF_4$:D, $RbBr$:D, $Sr(Cl,Br,I)_2$:D in $SiO_2$, $SrCl_2$ in $SiO_2$:D, $SrF_2$:D, $YF_3$:D, $ZnF_2$:D and $(Zn,Mg)F_2$:D.

Preferred examples of luminescent oxy compounds are oxysulfides and oxyhalides selected from: $Gd_2O_2S$:D, $La_2O_2S$:D, $LaOBr$:D, $LaOCl$:D, $LaOF$:D, $Y_2O_2S$:D, $YOBr$:D, $YOCl$:D and $YOF$:D.

Preferred luminescent SiAlONs are α-SiAlONe:D and β-SiAlONe:D.

Particularly preferred activators D for all the above-mentioned phosphor compounds are Eu(II), Ce(III), Mn(II), Mn(IV), Eu(III), Tb(III), Sm(III), Cr(III), Sn(II), Pb(II), Sb(III), Bi(III), Cu(I) and Ag(I) and mixtures thereof.

In a particularly preferred embodiment of the present invention, the luminescent material is an inorganic phosphor selected from the list consisting of $M^{2+}_2SiO_4$:D, $M^{2+}_3SiO_5$:D, β-SiAlONen:D, and $M^{2+}AlSiN_3$:D, where $M^{2+}$ is Be, Mg, Ca, Sr and/or Ba and D is Eu(II), and $M^{3+}_3(Al,Ga)_5O_{12}$:D, where $M^{3+}$ is Y, Lu, Tb and/or Gd and D is Ce(III).

For semiconductor nanoparticles which emit in the green spectral region from 520 to 540 nm, particularly preferred luminescent materials are Eu(II)-activated Ba—Sr orthosilicates having a peak emission in the range from 510 to 530 nm. Eu(II)-activated Ba—Sr orthosilicates of this type can be represented by the following empirical formula: $(Ba,Sr)_2SiO_4$:Eu(II). The degree of doping is typically in the range from 0.5 to 5 atom-%.

For semiconductor nanoparticles which emit in the orange spectral region from 576 to 600 nm, particularly preferred luminescent materials are Eu(II)-activated Ba—Sr oxyorthosilicates having a peak emission in the range from 585 to 600 nm. Eu(II)-activated Ba—Sr oxyorthosilicates of this type can be represented by the following empirical formula: $(Ba,Sr)_3SiO_5$:Eu(II). The degree of doping is typically in the range from 0.5 to 5 atom-%.

For semiconductor nanoparticles which emit in the red spectral region from 620 to 640 nm, particularly preferred luminescent materials are Eu(II)-activated Ca—Sr—Al—Si nitrides having a peak emission in the range from 610 to 630 nm. Eu(II)-activated Ca—Sr—Al—Si nitrides of this type can be represented by the following empirical formula: $(Ca,Sr)AlSiN_3$:Eu(11). The degree of doping is typically in the range from 0.5 to 5 atom-%.

The said examples of luminescent materials serve merely for illustration and should in no way be regarded as limiting with respect to the extent and scope of protection of the present invention.

Semiconductor nanoparticles which can be used in the light-converting material of the present invention are semiconductor materials in submicron size which are capable of emitting light having a certain wavelength when they are irradiated with optical excitation radiation having another (shorter) wavelength range. Semiconductor nanoparticles are frequently also called quantum materials. The light emitted by quantum materials is distinguished by a very narrow frequency range.

In a preferred embodiment of the present invention, the semiconductor nanoparticles comprise at least two different semiconductor materials. The semiconductor nanoparticles are preferably in the form of an alloy or in a core/shell configuration or core/multishell configuration having at least two shells, where the core comprises either a semiconductor material or an alloy of at least two different semiconductor materials and the shell(s) comprise(s) independently a semiconductor material or an alloy of at least two different semiconductor materials, where a concentration gradient may optionally be present within the core and/or the shell(s) and/or between the core and/or the shell(s).

In a particularly preferred embodiment, the semiconductor materials or the alloys of at least two different semiconductor materials in the core and the adjacent shell and/or in adjacent shells are different. Owing to the toxicity of Cd, ZnS is preferentially employed as shell material. This has the advantage that the quantum materials absorb less well in the typical region of blue LEDs around 450 nm. The additional adsorption of the emission of the luminescent material of the present invention leads here to a particularly great advantage in the final application.

As already described above, the semiconductor nanoparticles which are suitable for the purposes of the present invention are produced from semiconductor materials. Possible material compositions of the semiconductor nanoparticles which are suitable for the present invention are described in WO 2010/095140 A3 and WO 2011/092646 A2, the contents of which are hereby incorporated into the present application by way of reference. The semiconductor materials are preferably selected from group II-VI semiconductors, group III-V semiconductors, group IV-VI semiconductors, group I-III-$VI_2$ semiconductors and from alloys and/or combinations of these semiconductors, where the semiconductor materials may optionally be doped with one or more transition metals, such as, for example, Mn and/or Cu (cf. M. J. Anc, N. L. Pickett et al., ECS Journal of Solid State Science and Technology, 2013, 2(2), R3071-R3082).

Examples of group II-VI semiconductor materials are: CdSe, CdS, CdTe, ZnO, ZnSe, ZnS, ZnTe, HgS, HgSe, HgTe, CdZnSe and any desired combinations thereof.

Examples of group III-V semiconductor materials are: InAs, InP, InN, GaN, InSb, InAsP, InGaAs, GaAs, GaP, GaSb, AlP, AlN, AlAs, AlSb, CdSeTe, ZnCdSe and any desired combinations thereof.

Examples of group IV-VI semiconductor materials are: PbSe, PbTe, PbS, PbSnTe, $Tl_2SnTe_5$ and any desired combinations thereof.

Examples of group I-III-$VI_2$ semiconductor materials are: $CuGaS_2$, $CuGaSe_2$, $CuInS_2$, $CuInSe_2$, $Cu_2(InGa)S_4$, $AgInS_2$, $AgInSe_2$ and any desired combinations thereof.

The said examples of semiconductor materials for the semiconductor nanoparticles serve merely for illustration and should in no way be regarded as restrictive with respect to the extent and scope of protection of the present invention. The said semiconductor materials can be used either as an alloy or as a core or shell material in a core/shell configuration or in a core/multishell configuration.

The outer and inner shape of the semiconductor nanoparticles is not restricted further. The semiconductor nanoparticles are preferably in the form of nanodots, nanorods, nanoflakes, nanotetrapods, nanodots in nanorods, nanorods in nanorods and/or nanodots in nanoflakes.

The length of the nanorods is preferably between 8 and 500 nm and more preferably between 10 and 160 nm. The total diameter of a nanorod is preferably between 1 and 20 nm and more preferably between 1 and 10 nm. A typical nanorod has a side ratio (length to diameter) of preferably greater than or equal to 2 and more preferably of greater than or equal to 3.

In a more preferred embodiment, the semiconductor nanoparticles have high absorption in the region of the inherent emission (self-absorption). This is typically the case for materials having a ZnS shell or a very small shell.

The wavelength of the emitted light (emission colour) of the semiconductor nanoparticles in response to the excitation radiation can be selected in a suitable manner by adjustment of the shape, size and/or material composition of the nanoparticles. This flexibility with respect to the emission colour enables great variation of the colour of the light-converting material according to the invention. The emission of red light can be achieved, for example, by CdSe nanodots, CdSe nanorods, CdSe nanodots in CdS nanorods, ZnSe nanodots in CdS nanorods, CdSe/ZnS nanorods, InP nanodots, InP nanorods, CdSe/CdS nanorods, ZnSe nanodots in CdS nanorods and ZnSe/CdS nanorods. The emission of green light can be achieved, for example, by CdSe nanodots, CdSe nanorods, CdSe/CdS nanorods and CdSe/ZnS nanorods. The emission of blue light can be achieved, for example, by core/shell nanodots or core/shell nanorods based on ZnSe, ZnS, ZnSe/ZnS and/or CdS. This illustrative assignment between certain semiconductor nanoparticles and certain emission colours is not definitive and is merely intended to serve for illustration. The person skilled in the art is aware that different emission colours within certain material-dependent limits can be achieved by adjustment of the size of the semiconductor nanoparticles.

Further preferred semiconductor nanoparticles are nanorods having a core/shell configuration with materials selected from CdSe/CdS, CdSeS/CdS, ZnSe/CdS, ZnCdSe/CdS, CdSe/CdZnS, CdTe/CdS, InP/ZnSe, InP/CdS, InP/ZnS and $CuInS_2$/ZnS; and nanorods having a core/multishell configuration selected from CdSe/CdS/ZnS, CdSe/CdZnS/ZnS, ZnSe/CdS/ZnS, InP/ZnSe/ZnS, InP/CdS/ZnS and InP/CdZnS/ZnS.

In a preferred embodiment, the semiconductor nanoparticles are applied to the surface of a luminescent material, as described above, so that the semiconductor nanoparticles are present in a ratio of 0.01 to 20% by weight, preferably 0.1 to 5% by weight, based on the luminescent material.

In a preferred embodiment, the surface of the semiconductor nanoparticles is coated with one or more ligands. The ligands are not subject to any particular restriction, so long as they are suitable for the surface coating of semiconductor nanoparticles. Suitable ligands are, for example, phosphines and phosphine oxides, such as trioctylphosphine oxide (TOPO), trioctylphosphine (TOP) or tributylphosphine (TBP); phosphonic acids, such as dodecylphosphonic acid (DDPA), tridecylphosphonic acid (TBPA), octadecylphosphonic acid (ODPA) or hexylphosphonic acid (HPA); amines, such as dodecylamine (DDA), tetradecylamine (TDA), hexadecylamine (HDA) or octadecylamine (ODA); thiols, such as hexadecanethiol or hexanethiol; mercaptocarboxylic acids, such as mercaptopropionic acid or mercaptoundecanoic acid; and other acids, such as myristic acid, palmitic acid, oleic acid, caproic acid or adipic acid. It is not intended that the examples mentioned above are to be regarded as limiting.

It is furthermore preferred that the surface of the light-converting material of the present invention is coated with one or more coating materials. The coating materials are not subject to any particular restriction, so long as they are suitable for coating the surface of the light-converting material. Suitable materials are, for example, those which are also used for the coating of phosphors, such as, for example, inorganic or organic coating materials. The inorganic coating materials can be dielectric insulators, metal oxides (including transparent conductive oxides), metal nitrides or silicon dioxide-based materials (for example glasses). If a metal oxide is used, the metal oxide can be a single metal oxide (i.e. oxide ions combined with a single type of metal ion, such as, for example, $Al_2O_3$) or a mixed metal oxide (i.e. oxide ions combined with two or more types of metal ion, such as, for example, $SrTiO_3$, or a doped metal oxide, such as a doped transparent conductive oxide (TOO), such as, for example, Al-doped ZnO, Ga-doped ZnO, etc.). The metal ion or the metal ions of the (mixed) metal oxide can be selected from any suitable group of the Periodic Table, such as, for example, group 2, 13, 14 or 15, or they can be a d metal or a lanthanide metal.

Particular metal oxides include, but are not restricted to: $Al_2O_3$, ZnO, $HfO_2$, $SiO_2$, $ZrO_2$ and $TiO_2$, including combinations, alloys and/or doped species thereof; and/or TCOs, such as, for example, Al-doped ZnO, Ga-doped ZnO and $In_2O_3$. The inorganic coatings include silicon dioxide in any suitable form. In some embodiments, one or more of the inorganic coating materials is (are) a metal oxide selected from the group consisting of $Al_2O_3$, ZnO, $TiO_2$, $In_2O_3$ or combinations and/or doped species thereof. In particular embodiments, the metal oxide is a TCO, for example Al-doped ZnO or Ga-doped ZnO.

Particular metal nitrides include, but are not restricted to: AlN, BN, $Si_3N_4$, including combinations, alloys and/or doped species thereof.

It is also possible alternatively and/or additionally to apply an organic coating to the above-mentioned inorganic coating. The organic coating can likewise have an advantageous effect on the stability and durability of the light-converting materials and the dispersibility. Suitable organic materials are (poly)silazanes, such as preferably modified organic polysilazanes (MOPS) or perhydropolysilazanes (PHPS), and mixtures thereof, organic silanes and also other organic materials up to polymers.

The prior art discloses numerous processes for the application of coating materials to light-converting materials or phosphors. Thus, for example, WO 2014/140936, the contents of which are hereby incorporated into the present application by way of reference, describes processes such as, for example, chemical gas-phase deposition (CVD), physical gas-phase deposition (PVD) (including magnetron sputtering), Vitex technology, atom layer deposition (ALD) and molecular layer deposition (MLD). Furthermore, the coating can be carried out by a fluidised-bed process. Further coating processes are described in JP 04-304290, WO 91/10715, WO 99/27033, US 2007/0298250, WO 2009/065480 and WO 2010/075908, the contents of which are hereby incorporated by way of reference.

In order to build up a multilayered coating, different coating materials can be applied successively. Numerous coating materials, such as, for example, metal oxides, such as, for example, $Al_2O_3$, $SiO_2$, ZnO, $TiO_2$ and $ZrO_2$; metals, such as, for example, Pt and Pd; and polymers, such as, for example, poly(amides) and poly(imides), can be used for the coating of the light-converting material in accordance with the present invention. $Al_2O_3$ is one of the best-investigated coating materials which is applied with the aid of the atom layer deposition (ALD) process. $Al_2O_3$ can be applied to a substrate by alternate use of trimethylaluminium and water vapour as corresponding metal and oxygen sources and flushing of the ALD chamber with an inert carrier gas, such as, for example, $N_2$ or Ar, between each of these applications.

In a particularly preferred embodiment of the present invention, the light-converting material also comprises at least one further type of semiconductor nanoparticles, which are likewise located on the surface of the luminescent material and whose emission is not in the region of the emission from the luminescent material. This means that the above-mentioned equations (1) to (9) need not be satisfied for the at least one further type of semiconductor nanoparticles.

The light-converting material according to the invention is prepared by (A) providing a suspension of a luminescent material in a solvent; and (B) adding a suspension of semiconductor nanoparticles in a solvent.

Preferred solvents for the suspension of the luminescent material are water, methanol, ethanol and toluene.

Preferred solvents for the suspension of the semiconductor nanoparticles are PGMEA (1-methoxy-2-propyl acetate), toluene, methanol, ethanol and water.

After addition of the semiconductor nanoparticle suspension, the mixture is preferably stirred at room temperature (20 to 25° C.) for 0.5 to 5 h, before the solvent is subsequently removed in vacuo at elevated temperature, preferably 40 to 60° C.

The present invention furthermore provides a light-converting mixture which comprises one or more of the light-converting materials according to the invention. The light-converting mixture preferably additionally comprises at least one further luminescent material besides the light-converting material.

The light-converting mixture particularly preferably comprises one or more conversion phosphors besides the light-converting materials according to the invention. The light-converting materials and the conversion phosphors preferably emit light of different wavelengths which are complementary to one another. If the light-converting material according to the invention is a red-emitting material, this is preferably employed in combination with a cyan-emitting conversion phosphor or in combination with blue- and green- or yellow-emitting conversion phosphors. If the light-converting material according to the invention is a green-emitting material, this is preferably employed in combination with a magenta-emitting conversion phosphor or in combination with red- and blue-emitting conversion phosphors. It may thus be preferred for the light-converting material according to the invention to be employed in combination with one or more further conversion phosphors in the light-converting mixture according to the invention, so that white light is preferably emitted.

The light-converting mixture preferably comprises the light-converting material according to the invention in a ratio of 1 to 90% by weight, based on the total weight of the mixture.

In the context of this application, ultraviolet light denotes light whose emission maximum is between 100 and 399 nm, violet light denotes light whose emission maximum is between 400 and 430 nm, blue light denotes light whose emission maximum is between 431 and 480 nm, cyan light denotes light whose emission maximum is between 481 and 510 nm, green light denotes light whose emission maximum is between 511 and 565 nm, yellow light denotes light whose emission maximum is between 566 and 575 nm, orange light denotes light whose emission maximum is between 576 and 600 nm and red light denotes light whose emission maximum is between 601 and 750 nm.

The light-converting material according to the invention is preferably a red- or green-emitting conversion material.

The conversion phosphors which can be employed together with the light-converting material according to the invention and form the light-converting mixture according to the invention are not subject to any particular restriction. It is therefore generally possible to employ any possible conversion phosphor. The following, for example, are suitable here: $Ba_2SiO_4:Eu^{2+}$, $Ba_3SiO_5:Eu^{2+}$, $(Ba,Ca)_3SiO_5:Eu^{2+}$, $BaSi_2N_2O_2:Eu, BaSi_2O_5:Pb^{2+}$, $Ba_3Si_6O_{12}N_2:Eu$, $Ba_xSr_{1-x}F_2:Eu^{2+}$ (where $0 \le x \le 1$), $BaSrMgSi_2O_7:Eu^{2+}$, $BaTiP_2O_7$, $(Ba,Ti)_2P_2O_7:Ti$, $BaY_2F_8:Er^{3+},Yb^+$, $Be_2SiO_4:Mn^{2+}$, $Bi_4Ge_3O_{12}$, $CaAl_2O_4:Ce^{3+}$, $CaLa_4O_7:Ce^{3+}$, $CaAl_2O_4:Eu^{2+}$, $CaAl_2O_4:Mn^{2+}$, $CaAl_2O_7:Pb^{2+},Mn^{2+}$, $CaAl_2O_4:Tb^{3+}$, $Ca_3Al_2Si_3O_{12}:Ce^{3+}$, $Ca_3Al_2Si_3O_{12}:Ce^{3+}$, $Ca_3Al_2Si_3O_{12}:Eu^{2+}$, $Ca_2B_5O_9Br:Eu^{2+}$, $Ca_2B_5O_9Cl:Eu^{2+}$, $Ca_2B_5O_9Cl:Pb^{2+}$, $CaB_2O_4:Mn^{2+}$, $Ca_2B_2O_5:Mn^{2+}$, $CaB_2O_4:Pb^{2+}$, $CaB_2P_2O_9:Eu^{2+}$, $Ca_5B_2SiO_{10}:Eu^{3+}$, $Ca_{0.5}Ba_{0.5}Al_{12}O_{19}:Ce^{3+},Mn^{2+}$, $Ca_2Ba_3(PO_4)_3Cl:Eu^{2+}$, $CaBr_2:Eu^{2+}$ in $SiO_2$, $CaCl_2:Eu^{2+}$ in $SiO_2$, $CaCl_2:Eu^{2+}$, $Mn^{2+}$ in $SiO_2$, $CaF_2:Ce^{3+}$, $CaF_2:Ce^{3+}$, $Mn^{2+}$, $CaF_2:Ce^{3+}$, $Tb^{3+}$, $CaF_2:Eu^{2+}$, $CaF_2:Mn^{2+}$, $CaGa_2O_4:Mn^{2+}$, $CaGa_4O_7:Mn^{2+}$, $CaGa_2S_4:Ce^{3+}$, $CaGa_2S_4:Eu^{2+}$, $CaGa_2S_4:Mn^{2+}$, $CaGa_2S_4:Pb^{2+}$, $CaGeO_3:Mn^{2+}$, $Ca_{12}:Eu^{2+}$ in $SiO_2$, $CaI_2:Eu^{2+}$, $Mn^{2+}$ in $SiO_2$, $CaLaBO_4:Eu^{3+}$, $CaLaB_3O_7:Ce^{3+},Mn^{2+}$, $Ca_2La_2BO_{6.5}:Pb^{2+}$, $Ca_2MgSi_2O_7$, $Ca_2MgSi_2O_7:Ce^{3+}$, $CaMgSi_2O_6:Eu^{2+}$, $Ca_3MgSi_2O_8:Eu^{2+}$, $Ca_2MgSi_2O_7:Eu^{2+}$, $CaMgSi_2O_6:Eu^{2+}$, $Mn^{2+}$, $Ca_2MgSi_2O_7:Eu^{2+}$, $Mn^{2+}$, $CaMoO_4$, $CaMoO_4:Eu^{3+}$, $CaO:Bi^{3+}$, $CaO:Cd^{2+}$, $CaO:Cu^+$, $CaO:Eu^{3+}$, $CaO:Eu^{3+}$, $Na^+$, $CaO:Mn^{2+}$, $CaO:Pb^{2+}$, $CaO:Sb^{3+}$, $CaO:Sm^{3+}$, $CaO:Tb^{3+}$, $CaO:Tl$, $CaO:Zn^{2+}$, $Ca_2P_2O_7:Ce^{3+}$, $\alpha$-$Ca_3(PO_4)_2:Ce^{3+}$, $\beta$-$Ca_3(PO_4)_2:Ce^{3+}$, $Ca_6(PO_4)_3Cl:Eu^{2+}$, $Ca_5(PO_4)_3Cl:Mn^{2+}$, $Ca_5(PO_4)_3Cl:Sb^{3+}$, $Ca_5(PO_4)_3Cl:Sn^{2+}$, $\beta$-$Ca_3(PO_4)_2:Eu^{2+},Mn^{2+}$, $Ca_5(PO_4)_3F:Mn^{2+}$, $Ca_5(PO_4)_3F:Sb^{3+}$, $Ca_5(PO_4)_3F:Sn^{2+}$, $\alpha$-$Ca_3(PO_4)_2:Eu^{2+}$, $\beta$-$Ca_3(PO_4)_2:Eu^{2+}$, $Ca_2P_2O_7:Eu^{2+}$, $Ca_2P_2O_7:Eu^{2+}$, $Mn^{2+}$, $CaP_2O_6:Mn^{2+}$, $\alpha$-$Ca_3(PO_4)_2:Pb^{2+}$, $\alpha$-$Ca_3(PO_4)_2:Sn^{2+}$, $\beta$-$Ca_3(PO_4)_2:Sn^{2+}$, $\beta$-$Ca_2P_2O_7:Sn,Mn$, $\alpha$-$Ca_3(PO_4)_2:Tr$, $CaS:Bi^{3+}$, $CaS:Bi^{3+}$, $Na$, $CaS:Ce^{3+}$, $CaS:Eu^{2+}$, $CaS:Cu^+$, $Na^+$, $CaS:La^{3+}$, $CaS:Mn^{2+}$, $CaSO_4:Bi$, $CaSO_4:Ce^{3+}$, $CaSO_4:Ce^{3+},Mn^{2+}$, $CaSO_4:Eu^{2+}$, $CaSO_4:Eu^{2+},Mn^{2+}$, $CaSO_4:Pb^{2+}$, $CaS:Pb^{2+}$, $CaS:Pb^{2+}$, $Cl$, $CaS:Pb^{2+}$, $Mn^{2+}$, $CaS:Pr^{3+},Pb^{2+}$, $Cl$, $CaS:Sb^{3+}$, $CaS:Sb^{3+}$, $Na$, $CaS:Sm^{3+}$, $CaS:Sn^{2+}$, $CaS:Sn^{2+},F$, $CaS:Tb^{3+}$, $CaS:Tb^{3+}$, $Cl$, $CaS:Y^{3+}$, $CaS:Yb^{2+}$, $CaS:Yb^{2+}$, $Cl$, $CaSc_2O_4:Ce, Ca_3(Sc,Mg)_2Si_3O_{12}:Ce$, $CaSiO_3:Ce^{3+}$, $Ca_3SiO_4Cl_2:Eu^{2+}$, $Ca_3SiO_4Cl_2:Pb^{2+}$, $CaSiO_3:Eu^{2+}$, $Ca_3SiO_5:Eu^{2+}$, $(Ca,Sr)_3SiO_5:Eu^{2+}$, $(Ca,Sr)_3MgSi_2O_8:Eu^{2+}$, $(Ca,Sr)_3MgSi_2O_8:Eu^{2+},Mn^{2+}$, $CaSiO_3:Mn^{2+},Pb$, $CaSiO_3:Pb^{2+}$, $CaSiO_3:Pb^{2+}$, $Mn^{2+}$, $CaSiO_3:Ti^{4+}$, $CaSr_2(PO_4)_2:Bi^{3+}$, $\beta$-$(Ca,Sr)_3(PO_4)_2:Sn^{2+}Mn^{2+}$, $CaTi_{0.9}Al_{0.1}O_3:Bi^{3+}$, $CaTiO_3:Eu^{3+}$, $CaTiO_3:Pr^{3+}$, $Ca_5(VO_4)_3Cl$, $CaWO_4$, $CaWO_4:Pb^{2+}$, $CaWO_4:W$, $Ca_3WO_6:U$, $CaYAlO_4:Eu^{3+}$, $CaYBO_4:Bi^{3+}$, $CaYBO_4:Eu^{3+}$, $CaYB_{0.8}O_{3.7}:Eu^{3+}$, $CaY_2ZrO_6:Eu^{3+}$, $(Ca,Zn,Mg)_3(PO_4)_2:Sn$, $(Ce,Mg)BaAl_{11}O_{18}:Ce$, $(Ce,Mg)SrAl_{11}O_{18}:Ce$, $CeMgAl_{11}O_{19}:Ce:Tb$, $Cd_2B_6O_{11}:Mn^{2+}$, $CdS:Ag^+,Cr$, $CdS:In$, $CdS:In$, $CdS:In$, $Te$, $CdS:Te$, $CdWO_4$, $CsF$, $CsI$, $CsI:Na^+$, $CsI:Tl$, $(ErCl_3)_{0.25}(BaCl_2)_{0.75}$, $GaN:Zn$, $Gd_3Ga_5O_{12}:Cr^{3+}$, $Gd_3Ga_5O_{12}:Cr,Ce$, $GdNbO_4:Bi^{3+}$, $Gd_2O_2S:Eu^{3+}$, $Gd_2O_2Pr^{3+}$, $Gd_2O_2S:Pr,Ce,F$, $Gd_2O_2S:Tb^{3+}$, $Gd_2SiO_5:Ce^{3+}$, $KAl_{11}O_{17}:Tl^+$, $KGa_{11}O_{17}:Mn^{2+}$, $K_2La_2Ti_3O_{10}:Eu$, $KMgF_3:Eu^{2+}$, $KMgF_3:Mn^{2+}$, $K_2SiF_6:Mn^{4+}$, $LaAl_3B_4O_{12}:Eu^{3+}$, $LaAlB_2O_6:Eu^{3+}$, $LaAlO_3:Eu^{3+}$, $LaAlO_3:Sm^{3+}$, $LaAsO_4:Eu^{3+}$, $LaBr_3:Ce^{3+}$, $LaBO_3:Eu^{3+}$, $LaCl_3:Ce^{3+}$, $La_2O_3:Bi^{3+}$, $LaOBr:Tb^{3+}$, $LaOBr:Tm^{3+}$, $LaOCl:Bi^{3+}$, $LaOCl:Eu^{3+}$, $LaOF:Eu^{3+}$, $La_2O_3:Eu^{3+}$, $La_2O_3:Pr^{3+}$, $La_2O_2S:Tb^{3+}$, $LaPO_4:Ce^{3+}$, $LaPO_4:Eu^{3+}$, $LaSiO_3Cl:Ce^{3+}$, $LaSiO_3Cl:Ce^{3+},Tb^{3+}$, $LaVO_4:Eu^{3+}$, $La_2W_3O_{12}:Eu^{3+}$, $LiAlF_4:Mn^{2+}$, $LiAl_5O_8:Fe^{3+}$, $LiAlO_2:Fe^{3+}$, $LiAlO_2:Mn^{2+}$, $LiAl_5O_8:Mn^{2+}$, $Li_2CaP_2O_7:Ce^{3+},Mn^{2+}$, $LiCeBa_4Si_4O_{14}:Mn^{2+}$, $LiCeSrBa_3Si_4O_{14}:Mn^{2+}$, $LiInO_2:Eu^{3+}$, $LiInO_2:Sm^{3+}$, $LiLaO_2:Eu^{3+}$, $LuAlO_3:Ce^{3+}$, $(Lu,Gd)_2SiO_5:Ce^{3+}$, $Lu_2SiO_5:Ce^{3+}$, $Lu_2Si_2O_7:Ce^{3+}$, $LuTaO_4:Nb^{5+}$, $Lu_{1-x}Y_xAlO_3:Ce^{3+}$ (where $0 \le x \le 1$), $(Lu,Y)_3(Al,Ga,Sc)_5O_{12}:Ce$, $MgAl_2O_4:Mn^{2+}$, $MgSrAl_{10}O_{17}:Ce$, $MgB_2O_4:Mn^{2+}$, $MgBa_2(PO_4)_2:Sn^{2+}$, $MgBa_2(PO_4)_2:U$, $MgBaP_2O_7:Eu^{2+}$, $MgBaP_2O_7:Eu^{2+},Mn^{2+}$, $MgBa_3Si_2O_8:Eu^{2+}$, $MgBa(SO_4)_2:Eu^{2+}$, $Mg_3Ca_3(PO_4)_4:Eu^{2+}$, $MgCaP_2O_7:Mn^{2+}$, $Mg_2Ca(SO_4)_3:Eu^{2+}$, $Mg_2Ca(SO_4)_3:Eu^{2+},Mn^2$, $MgCeAl_nO_{19}:Tb_{3+}$, $Mg_4(F)GeO_6:Mn^{2+}$, $Mg_4(F)(Ge,Sn)O_6:Mn^{2+}$, $MgF_2:Mn^{2+}$, $MgGa_2O_4:Mn^{2+}$, $Mg_8Ge_2O_{11}F_2:Mn^{4+}$, $MgS:Eu^{2+}$, $MgSiO_3:Mn^{2+}$, $Mg_2SiO_4:Mn^{2+}$, $Mg_3SiO_3F_4:Ti^{4+}$, $MgSO_4:Eu^{2+}$, $MgSO_4:Pb^{2+}$, $MgSrBa_2Si_2O_7:Eu^{2+}$, $MgSrP_2O_7:Eu^{2+}$, $MgSr_5(PO_4)_4:Sn^{2+}$, $MgSr_3Si_2O_8:Eu^{2+},Mn^{2+}$, $Mg_2Sr(SO_4)_3:Eu^{2+}$, $Mg_2TiO_4:Mn^{4+}$, $MgWO_4$, $MgYBO_4:Eu^{3+}$, $M^2MgSi_2O_7:Eu^{2+}$ (M=Ca, Sr, and/or Ba), $M_2MgSi_2O_7:Eu^{2+},Mn^{2+}$ (M=Ca, Sr and/or Ba), $M_2MgSi_2O_7:Eu^{2+},Zr^{4+}$ (M=Ca, Sr, and/or Ba), $M^2MgSi_2O_7:Eu^{2+},Mn^{2+},Zr^{4+}$(M=Ca, Sr and/or Ba), $Na_3Ce(PO_4)_2:Tb^{3+}$, $Na_{1.23}K_{0.42}Eu_{0.12}TiSi_4O_{11}:Eu^{3+}$, $Na_{1.23}K_{0.42}Eu_{0.12}TiSi_5O_{13} \cdot xH_2O:Eu^{3+}$, $Na_{1.29}K_{0.46}Er_{0.08}TiSi_4O_{11}:Eu^{3+}$, $Na_2Mg_3Al_2Si_2O_{10}:Tb$, $Na(Mg_{2-x}Mn_x)LiSi4O_{10}F_2:Mn$ (where $0 \le x \le 2$), $NaYF_4:Er^{3+},Yb^{3+}$, $NaYO_2:Eu^{3+}$, P46 (70%)+P47 (30%), β-SiAlON:Eu, $SrAl_{12}O_{19}:Ce^{3+}$, $Mn^{2+}$, $SrAl_2O_4:Eu^{2+}$, $SrAl_4O_7:Eu^{3+}$, $SrAl_{12}O_{19}:Eu^{2+}$, $SrAl_2S_4:Eu^{2+}$, $Sr_2B_5O_9Cl:Eu^{2+}$, $SrB_4O_7:Eu^{2+}(F,Cl,Br)$, $SrB_4O_7:Pb^{2+}$, $SrB_4O_7:Pb^{2+}$, $Mn^{2+}$, $SrB_8O_{13}:Sm^{2+}$, $Sr_xBa_yCl_zAl_2O_{4-z/2}:Mn^{2+}$, $Ce^{3+}$, $SrBaSiO_4:Eu^{2+}$, $(Sr,Ba)_3SiO_5:Eu$, $(Sr, Ca)Si_2N_2O_2:Eu$, $Sr(Cl,Br,I)_2:Eu^{2+}$ in $SiO_2$, $SrCl_2:Eu^{2+}$ in $SiO_2$, $Sr_5Cl(PO_4)_3:Eu$, $Sr_wF_xB_4O_{6.5}:Eu^{2+}$, $Sr_wF_xB_yO_z:Eu^{2+},Sm^{2+}$, $SrF_2:Eu^{2+}$, $SrGa_{12}O_{19}:Mn^{2+}$, $SrGa_2S_4:Ce^{3+}$, $SrGa_2S_4:Eu^{2+}$, $Sr_{2-y}Ba_ySiO_4:Eu$ (where $0 \le y \le 2$), $SrSi_2O_2N_2:Eu$, $SrGa_2S_4:Pb^{2+}$, $SrIn_2O_4:Pr^{3+}$, $Al^{3+}$, $(Sr,Mg)_3(PO_4)_2:Sn$, $SrMgSi_2O_6:Eu^{2+}$, $Sr_2MgSi_2O_7:Eu^{2+}$, $Sr_3MgSi_2O_8:Eu^{2+}$, $SrMoO_4:U$, $SrO \cdot 3B_2O_3:Eu^{2+},Cl$, β-$SrO \cdot 3B_2O_3:Pb^{2+}$, β-$SrO \cdot 3B_2O_3:Pb^{2+},Mn^{2+}$, α-$SrO \cdot 3B_2O_3:Sm^{2+}$, $Sr_6P_5BO_{20}:Eu, Sr_5(PO_4)_3Cl:Eu^{2+}$, $Sr_5(PO_4)_3Cl:Eu^{2+},Pr^{3+}$, $Sr_5(PO_4)_3Cl:Mn^{2+}$, $Sr_5(PO_4)_3Cl:Sb^{3+}$, $Sr_2P_2O_7:Eu^{2+}$, β-$Sr_3(PO_4)_2:Eu^{2+}$, $Sr_5(PO_4)_3F:Mn^{2+}$, $Sr_5$ $(PO_4)_3F:Sb^{3+}$, $Sr_5(PO_4)_3F:Sb^{3+},Mn^{2+}$, $Sr_5(PO_4)_3F:Sn^{2+}$, $Sr_2P_2O_7:Sn^{2+}$, $\beta\text{-}Sr_3(PO_4)_2:Sn^{2+}$, $\beta\text{-}Sr_3(PO_4)_2:Sn^{2+},Mn^{2+}(Al)$, $SrS:Ce^{3+}$, $SrS:Eu^{2+}$, $SrS:Mn^{2+}$, $SrS:Cu^+,Na$, $SrSO_4:Bi$, $SrSO_4:Ce^{3+}$, $SrSO_4:Eu^{2+}$, $SrSO_4:Eu^{2+},Mn^{2+}$, $Sr_5Si_4O_{10}Cl_6:Eu^{2+}$, $Sr_2SiO_4:Eu^{2+}$, $Sr_3SiO_5:Eu^{2+}$, $(Sr,Ba)_3SiO_5:Eu^{2+}$, $SrTiO_3:Pr^{3+}$, $SrTiO_3:Pr^{3+}, Al^{3+}, SrY_2O_3:Eu^{3+}$, $ThO_2:Eu^{3+}$, $ThO_2:Pr^{3+}$, $ThO_2:Tb^{3+}$, $YAl_3B_4O_{12}:Bi^{3+}$, $YAl_3B_4O_{12}:Ce^{3+}$, $YAl_3B_4O_{12}:Ce^{3+},Mn$, $YAl_3B_4O_{12}:Ce^{3+},Tb^{3+}$, $YAl_3B_4O_{12}:Eu^{3+}$, $YAl_3B_4O_{12}:Eu^{3+},Cr^{3+}$, $YAl_3B_4O_{12}:Th^{4+},Ce^{3+},Mn^{2+}$, $YAlO_3:Ce^{3+}$, $Y_3Al_5O_{12}:Ce^{3+}$, $Y_3Al_5O_{12}:Cr^{3+}$, $YAlO_3:Eu^{3+}$, $Y_3Al_5O_{12}:Eu^{3+}$, $Y_4Al_2O_9:Eu^{3+}$, $Y_3Al_5O_{12}:Mn^{4+}$, $YAlO_3:Sm^{3+}$, $YAlO_3:Tb^{3+}$, $Y_3Al_5O_{12}:Tb^{3+}$, $YAsO_4:Eu^{3+}$, $YBO_3:Ce^{3+}$, $YBO_3:Eu^{3+}$, $YF_3:Er^{3+},Yb^{3+}$, $YF_3:Mn^{2+}$, $YF_3:Mn^{2+},Th^{4+}$, $YF_3:Tm^{3+},Yb^{3+}$, $(Y,Gd)BO_3:Eu$, $(Y,Gd)BO_3:Tb$, $(Y,Gd)_2O_3:Eu^{3+}$, $Y_{1.34}Gd_{0.60}O_3(Eu,Pr)$, $Y_2O_3:Bi^{3+}$, $YOBr:Eu^{3+}$, $Y_2O_3:Ce$, $Y_2O_3:Er^{3+}$, $Y_2O_3:Eu^{3+}$, $Y_2O_3:Ce^{3+},Tb^{3+}$, $YOCl:Ce^{3+}$, $YOCl:Eu^{3+}$, $YOF:Eu^{3+}$, $YOF:Tb^{3+}$, $Y_2O_3:Ho^{3+}$, $Y_2O_2S:Eu^{3+}$, $Y_2O_2S:Pr^{3+}$, $Y_2O_2S:Tb^{3+}$, $Y_2O_3:Tb^{3+}$, $YPO_4:Ce^{3+}$, $YPO_4:Ce^{3+},Tb^{3+}$, $YPO_4:Eu^{3+}$, $YPO_4:Mn^{2+},Th^{4+}$, $YPO_4:V^{5+}$, $Y(P,V)O_4:Eu$, $Y_2SiO_5:Ce^{3+}$, $YTaO_4$, $YTaO_4:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBa_2S_3:Mn^{2+}$, $(Zn,Be)_2SiO_4:Mn^{2+}$, $Zn_{0.4}Cd_{0.6}S:Ag$, $Zn_{0.6}Cd_{0.4}S:Ag$, $(Zn,Cd)S:Ag,Cl$, $(Zn,Cd)S:Cu$, $ZnF_2:Mn^{2+}$, $ZnGa_2O_4$, $ZnGa_2O_4:Mn^{2+}$, $ZnGa_2S_4:Mn^{2+}$, $Zn_2GeO_4:Mn^{2+}$, $(Zn,Mg)F_2:Mn^{2+}$, $ZnMg_2(PO_4)_2:Mn^{2+}$, $(Zn,Mg)_3(PO_4)_2:Mn^{2+}$, $ZnO:Al^{3+},Ga^{3+}$, $ZnO:Bi^{3+}$, $ZnO:Ga^{3+}$, $ZnO:Ga$, $ZnO\text{—}CdO:Ga$, $ZnO:S$, $ZnO:Se$, $ZnO:Zn$, $ZnS:Ag^+,Cl^-$, $ZnS:Ag,Cu,Cl$, $ZnS:Ag,Ni$, $ZnS:Au,In$, $ZnS\text{—}CdS$ (25-75), $ZnS\text{—}CdS$ (50-50), $ZnS\text{—}CdS$ (75-25), $ZnS\text{—}CdS:Ag,Br,Ni$, $ZnS\text{—}CdS:Ag^+,Cl$, $ZnS\text{—}CdS:Cu,Br$, $ZnS\text{—}CdS:Cu,I$, $ZnS:Cl^-$, $ZnS:Eu^{2+}$, $ZnS:Cu$, $ZnS:Cu^+,Al^{3+}$, $ZnS:Cu^+,Cl^-$, $ZnS:Cu,Sn$, $ZnS:Eu^{2+}$, $ZnS:Mn^{2+}$, $ZnS:Mn,Cu$, $ZnS:Mn^{2+},Te^{2+}$, $ZnS:P$, $ZnS:P^{3-},Cl^-$, $ZnS:Pb^{2+}$, $ZnS:Pb^{2+},Cl^-$, $ZnS:Pb,Cu$, $Zn_3(PO_4)_2:Mn^{2+}$, $Zn_2SiO_4:Mn^{2+}$, $Zn_2SiO_4:Mn^{2+},As^{5+}$, $Zn_2SiO_4:Mn,Sb_2O_2$, $Zn_2SiO_4:Mn^{2+},P$, $Zn_2SiO_4:Ti^{4+}$, $ZnS:Sn^{2+}$, $ZnS:Sn,Ag$, $ZnS:Sn^{2+},Li^+$, $ZnS:Te,Mn$, $ZnSZnTe:Mn^{2+}$, $ZnSe:Cu^+,Cl$ and $ZnWO_4$.

The light-converting material or the light-converting mixture in accordance with the present invention can be used for the partial or complete conversion of ultraviolet and/or blue light into light having a longer wavelength, such as, for example, green or red light. The present invention thus furthermore relates to the use of the light-converting material or light-converting mixture in a light source. The light source is particularly preferably an LED, in particular a phosphor-converted LED, pc-LED for short. It is particularly preferred here for the light-converting material to be mixed with at least one further light-converting material and/or one or more conversion phosphors and thus to form a light-converting mixture, which emits, in particular, white light or light having a certain colour point (colour-on-demand principle). "Colour-on-demand principle" is taken to mean the generation of light of a certain colour point by means of a pc-LED using one or more light-emitting materials and/or conversion phosphors.

The present invention thus furthermore relates to a light source which contains a primary light source and at least one light-converting material according to the invention or at least one light-converting mixture according to the invention. Here too, it is particularly preferred for the light source, besides the light-converting material according to the invention, also to contain a further light-converting material according to the invention, luminescent material and/or semiconductor nanoparticles, so that the light source preferably emits white light or light having a certain colour point.

The light source according to the invention is preferably a pc-LED which comprises a primary light source and a light-converting material or a light-converting mixture. The light-converting material or the light-converting mixture is preferably formed in the form of a layer, where the layer may comprise a multiplicity of part-layers, where each of the part-layers may comprise a different light-converting material or a different light-converting mixture. The layer may thus either comprise a single light-converting material or a single light-converting mixture or a multiplicity of part-layers, where each part-layer in turn comprises a different light-converting material or a different light-converting mixture. The thickness of the layer can be in the range from a few millimetres to a few microns, preferably in the range between 2 mm and 5 μm, depending on the particle size of the light-converting material or light-converting mixture and the requisite optical features.

In some embodiments for modulation of the emission spectrum of an LED, a single layer or a layer having part-layers may be formed on the primary light source. The layer or the layer having part-layers may either be arranged directly on the primary light source or separated from the primary light source by air, vacuum or a filling material. The filling material (for example silicone or epoxy) can serve as thermal insulation and/or as optical scattering layer. The modulation of the emission spectrum of the primary light source can serve lighting purposes in order to generate light emission having a broad colour spectrum, for example "white" light having a high colour rendering index (CRI) and the desired correlated colour temperature (CCT). The light emission having a broad colour spectrum is generated by converting part of the light originally generated by the primary light source into longer-wave light. An increase in the intensity of red is important in order to obtain "warmer" light having a lower CCT (for example 2,700-3,500 K), but also "smoothing" of specific regions in the spectrum, such as, for example, in the transition from blue to green, can likewise improve the CRI. The modulation of the LED lighting can also be used for optical display purposes.

The light-converting material according to the invention or the light-converting mixture according to the invention may be dispersed in an encapsulation material, such as, for example, a glass, silicone, silazane or epoxy resin, or formed as ceramic material. The encapsulation material is a light-transmitting matrix material which includes the light-converting material according to the invention or the light-converting mixtures according to the invention. Preferred examples of the encapsulation material, which should in no way be regarded as limiting, are mentioned above. The light-converting material or the light-converting mixture is preferably employed in a ratio of 3 to 80% by weight, based on the encapsulation material, depending on the desired optical properties and the structure of the application.

In a preferred embodiment, the light-converting material according to the invention or the light-converting mixture according to the invention is arranged directly on the primary light source.

In an alternative preferred embodiment, the light-converting material according to the invention or the light-converting mixture according to the invention is arranged on a support material remote from the primary light source (so-called remote phosphor principle).

The primary light source of the light source according to the invention can be a semiconductor chip, a luminescent light source, such as ZnO, a so-called TCO (transparent conducting oxide), a ZnSe- or SiC-based arrangement, an arrangement based on an organic light-emitting layer (OLED) or a plasma or discharge source, most preferably a semiconductor chip. If the primary light source is a semiconductor chip, it is preferably a luminescent indium aluminium gallium nitride (InAlGaN), as is known from the prior art. Possible forms of primary light sources of this type are known to the person skilled in the art. Lasers are furthermore suitable as light source.

The light-converting material according to the invention or the light-converting mixture according to the invention can be converted into any desired outer shapes, such as, for example, spherical particles, flakes and structured materials and ceramics, for use in light sources, in particular pc-LEDs. These shapes are summarized under the term "shaped bodies". The shaped bodies are consequently light-converting shaped bodies.

The present invention furthermore relates to a process for the production of a light source, in which the light-converting material or the light-converting mixture is applied to the primary light source or the support material in the form of a film by spin coating or spray coating or in the form of a film as laminate.

The invention furthermore relates to a lighting unit which contains at least one light source according to the invention. The use of the lighting unit is not subject to any particular restriction. Thus, the lighting unit can be employed, for example, in optical display devices, in particular liquid-crystal display devices (LC displays), having backlighting. The present invention therefore also relates to a display device of this type. In the lighting unit according to the invention, the optical coupling between the light-converting material or the light-converting mixture and the primary light source (in particular semiconductor chip) is preferably effected by a light-conducting arrangement or device. This makes it possible for the primary light source to be installed at a central location and to be optically coupled to the light-converting material or the light-converting mixture by means of light-conducting devices, such as, for example, light-conducting fibres. In this way, lamps matched to the lighting wishes, consisting of one or more different light-converting materials or mixtures, which may be arranged to form a light screen, and an optical waveguide, which is coupled to the primary light source, can be achieved. This makes it possible to place a strong primary light source at a location which is favourable for electrical installation and to install lamps comprising light-converting materials or mixtures which are coupled to the optical waveguides at any desired locations without further electrical cabling, only by laying optical waveguides.

The following examples and figures are intended to illustrate the present invention. However, they should in no way be regarded as limiting.

Examples

All emission spectra were recorded in an Ulbricht sphere combined with an OceanOptics QE Pro spectrometer. The excitation light source used for recording powder spectra is a halogen cold-light source with monochromator, and the excitation wavelength-dependent intensity was recorded using a photomultiplier. The LEDs tested are operated by means of a Keithley SourceMeter (the 5630 LED with ~450 nm chip wavelength at 60 mA was used for the experiments shown here).

The particle-size distributions were recorded using a Beckman Coulter Multisizer III in isotonic saline solution. >100,000 particles were measured in each case.

Working examples for the preparation of the light-converting material

Orange or Red:

Example 1: 5 g of an orange pulverulent, $Eu^{2+}$-activated silicate phosphor (($Ba,Sr)_3SiO_5$ with $\lambda_{em,max}$=600 nm) are suspended in 15 ml of toluene in a 100 ml flask. 50 mg of a red nanodot suspension (20% weight of CdSe/CdS-based semiconductor nanocrystals having a peak emission wavelength of 625 nm in toluene) are added to the suspension. This suspension is stirred for 1 h. The solvent is carefully removed in vacuo in a rotary evaporator at a water bath temperature of 50° C. The treated silicate powder (QD red 1) is dried in vacuo at a water bath temperature 50° C. for a further 1.5 h.

Example 2: 5 g of an orange pulverulent, $Eu^{2+}$-activated silicate phosphor (($Ba,Sr)_3SiO_5$ with $\lambda_{em,max}$=600 nm) are suspended in 15 ml of toluene in a 100 ml flask. 1.74 g of a red nanodot suspension (10% by weight of InP/ZnS-based semiconductor nanocrystals having a peak emission wavelength of 648 nm in toluene) are added to the suspension. This suspension is mixed by stirring for 2.5 h. The solvent is carefully removed in vacuo in a rotary evaporator at a water bath temperature of 50° C. For complete removal of the solvent, the treated silicate (QD red 2) is left in vacuo in the rotary evaporator at 50° C. for a further two hours.

Example 3: 2.5 g of a red pulverulent, $Eu^{2+}$-activated nitride phosphor ($CaAlSiN_3$ with $\lambda_{em,max}$=613 nm) are suspended in 15 ml of toluene in a 100 ml flask. 250 mg of a red nanodot suspension (20% weight of CdSe/CdS-based semiconductor nanocrystals having a peak emission wavelength of 625 nm in toluene) are added to the suspension. This suspension is stirred for 1 h. The solvent is carefully removed in vacuo in a rotary evaporator at a water bath temperature of 50° C. For complete removal of the solvent, the treated silicate (QD red 3) is left in vacuo in the rotary evaporator at 50° C. for a further two hours.

Example 4: 5 g of an orange pulverulent, $Eu^{2+}$-activated silicate phosphor (($Ba,Sr)_3SiO_5$ with $\lambda_{em,max}$=585 nm) are suspended in 15 ml of ethanol in a 100 ml flask. 650 mg of a red nanodot suspension (15% by weight of CdSe/CdS-based semiconductor nanocrystals having a peak emission wavelength of 627 nm in PGMEA) are added to the suspension. This suspension is stirred for 2.5 h. The solvent is carefully removed in vacuo in a rotary evaporator at a water bath temperature of 50° C. The treated silicate powder (QD red 4) is dried in vacuo at a water bath temperature of 50° C. for a further 2.5 h.

Green:

Example 5: 5 g of a green pulverulent, $Eu^{2+}$-activated silicate phosphor (($Ba,Sr)_2SiO_4$ with $\lambda_{em,max}$=517 nm) are suspended in 15 ml of toluene in a 100 ml flask. 600 mg of a green nanodot suspension (20% by weight of CdSe/CdS/ZnS-based semiconductor nanocrystals having a peak emission wavelength of 525 nm in toluene) are added to the suspension. This suspension is stirred for 2 h. The solvent is carefully removed in vacuo in a rotary evaporator at a water bath temperature of 50° C. The treated silicate powder (QD green 1) is dried in vacuo at a water bath temperature of 50° C. for a further hour.

Example 6: 5 g of a green pulverulent, $Eu^{2+}$-activated silicate (($Ba,Sr)_2SiO_4$ with $\lambda_{em,max}$=520 nm) are suspended in 15 ml of ethanol in a 100 ml flask. 1.0 g of a green nanodot suspension (10% by weight of CdSe/CdS/ZnS-based semiconductor nanocrystals having a peak emission wavelength of 525 nm in water) are added to the suspension. This suspension is stirred for 4 h. The solvent is carefully removed in vacuo in a rotary evaporator at a water bath temperature of 55° C. The treated silicate powder (QD green 2) is dried in vacuo at a water bath temperature of 55° C. for a further hour.

Example 7: 5 g of a green pulverulent, $Eu^{2+}$-activated silicate phosphor ($(Ba,Sr)_2SiO_4$ with $\lambda_{em,max}$=524 nm) are suspended in 15 ml of ethanol in a 100 ml flask. 1.05 g of a green nanodot suspension (10% by weight of CdSe/CdS/ZnS-based semiconductor nanocrystals having a peak emission wavelength of 525 nm in water) are added to the suspension. This suspension is stirred for 3 h. The solvent is carefully removed in vacuo in a rotary evaporator at a water bath temperature of 50° C. The treated silicate powder (QD green 3) is dried in vacuo at a water bath temperature of 50° C. for a further hour.

Example 8: 5 g of a green pulverulent, $Eu^{2+}$-activated silicate phosphor ($(Ba,Sr)_2SiO_4$ with $\lambda_{em,max}$=515 nm) are suspended in 15 ml of ethanol in a 100 ml flask. 1.05 g of a green nanodot suspension (10% by weight of CdSe/CdS/ZnS-based semiconductor nanocrystals having a peak emission wavelength of 525 nm in water) are added to the suspension. This suspension is stirred for 1.5 h. The solvent is carefully removed in vacuo in a rotary evaporator at a water bath temperature of 55° C. The treated silicate powder (QD green 4) is dried in vacuo at a water bath temperature of 55° C. for a further hour.

Example 9: 5 g of a green pulverulent, $Eu^{2+}$-activated silicate phosphor ($(Ba,Sr)_2SiO_4$ with $\lambda_{em,max}$=521 nm) are suspended in 15 ml of ethanol in a 100 ml flask. 1.55 g of a green nanodot suspension (10% by weight of CdSe/CdS/ZnS-based semiconductor nanocrystals having a peak emission wavelength of 525 nm in water) are added to the suspension. This suspension is stirred for 1.5 h. The solvent is carefully removed in vacuo in a rotary evaporator at a water bath temperature of 55° C. The treated silicate powder (QD green 5) is dried in vacuo at a water bath temperature of 55° C. for a further hour.

Green/Red:

Example 10: 5 g of a green pulverulent, $Eu^{2+}$-activated orthosilicate phosphor ($(Sr,Ba)_2SiO_4$) with $\lambda_{em,max}$=520 nm) are suspended in 15 ml of toluene in a 100 ml flask. 82 mg of a red nanodot suspension (20% by weight of CdSe/CdS-based semiconductor nanocrystals having a peak emission wavelength of 625 nm in toluene) and 416 mg of a green nanodot suspension (20% by weight of CdSe/CdS/ZnS nanorods having a peak emission wavelength of 525 nm in toluene) are added to the suspension. This suspension is stirred for 1 h. The solvent is carefully removed in vacuo in a rotary evaporator at a water bath temperature of 50° C. For complete removal of the solvent, the treated silicate (QD red/green 1) is left in vacuo in the rotary evaporator at 50° C. for a further hour.

Example 11: 5 g of a green pulverulent, $Eu^{2+}$-activated orthosilicate phosphor ($(Sr,Ba)_2SiO_4$ with $\lambda_{em,max}$=520 nm) are suspended in 15 ml of toluene in a 100 ml flask. 71 mg of a red nanodot suspension (20% by weight of CdSe/CdS-based semiconductor nanocrystals having a peak emission wavelength of 625 nm in toluene) are added to the suspension. This suspension is stirred for 1 h. The solvent is carefully removed in vacuo in a rotary evaporator at a water bath temperature of 50° C. For complete removal of the solvent, the treated silicate is left in vacuo in the rotary evaporator at 50° C. for a further hour. The treated silicate is subsequently suspended in 10 ml of ethanol, and 810 mg of a green nanodot suspension (10% by weight of CdSe/CdS/ZnS-based semiconductor nanocrystals having a peak emission wavelength of 525 nm in water) are added. After stirring for one hour at room temperature, the solvent is carefully removed in vacuo in a rotary evaporator at a water bath temperature of 50° C. For complete removal of the solvent, the treated silicate (QD red/green 2) is left in vacuo in the rotary evaporator at 50° C. for a further two hours.

Reference Examples

Example 12: 5 g of a blue pulverulent $Eu^{2+}$-activated orthosilicate phosphor ($(Sr,Ca)_3MgSi_2O_8$) with $\lambda_{em,max}$=466 nm) are suspended in 15 ml of ethanol in a 100 ml flask. 1.05 g of a green nanodot suspension (10% by weight of CdSe/CdS/ZnS-based semiconductor nanocrystals having a peak emission wavelength of 525 nm in water) are added to the suspension. This suspension is stirred for 1.5 h. The solvent is carefully removed in vacuo in a rotary evaporator at a water bath temperature of 55° C. The treated silicate powder (QD green 6) is dried in vacuo at a water bath temperature of 55° C. for a further hour Example 13: 5 g of an orange pulverulent $Eu^{2+}$-activated silicate phosphor ($(Ba,Sr)_3SiO_5$ with $\lambda_{em,max}$=585 nm) are suspended in 15 ml of ethanol in a 100 ml flask. 1.05 g of a green nanodot suspension (10% by weight of CdSe/CdS/ZnS-based semiconductor nanocrystals having a peak emission wavelength of 525 nm in water) are added to the suspension. This suspension is stirred for 2.5 h. The solvent is carefully removed in vacuo in a rotary evaporator at a water bath temperature of 50° C. The treated silicate powder (QD green 7) is dried in vacuo at a water-bar temperature of 50° C. for a further 2.5 h.

Table 1 below shows the luminescent materials used in Examples 1 to 13 and the semiconductor nanoparticles (QDs). The peak wavelength maxima $\lambda_{em,max}$ of the luminescent materials used and the peak wavelength maxima $\lambda_{em,max}$ of the semiconductor nanoparticles used and the peak wavelength maxima $\lambda_{em,max}$ and the full width at half maximum FWHM values of the emissions of the light-converting materials prepared are given. The emission from the semiconductor nanoparticles used was measured, as described above, in dilute suspension. The peak wavelength maxima $\lambda_{em,max}$ and full width at half maximum FWHM values of the emissions of the light-converting materials prepared were measured in the powder and, owing to reabsorption effects, exhibit a long-wave shift in relation to the pure semiconductor nanoparticle emissions.

TABLE 1

| Example | $\lambda_{em, max}$ (luminescent material) | $\lambda_{em, max}$ (semiconductor nanoparticles) | $\lambda_{max}$/nm (product) | FWHM/nm (product) |
|---|---|---|---|---|
| | Nitride (613 nm) | — | 613 | 72 |
| | Silicate (600 nm) | — | 600 | 78 |
| | Silicate (585 nm) | — | 585 | 67 |
| | Silicate (524 nm) | — | 524 | 64 |
| | Silicate (520 nm) | — | 520 | 65 |

TABLE 1-continued

| Example | $\lambda_{em, max}$ (luminescent material) | $\lambda_{em, max}$ (semiconductor nanoparticles) | $\lambda_{max}$/nm (product) | FWHM/nm (product) |
|---|---|---|---|---|
|  | Silicate (517 nm) | — | 517 | 63 |
|  | Silicate (515 nm) | — | 515 | 63 |
| 1 | Silicate (600 nm) | Red 1 (625 nm) | 625 | 33 |
| 2 | Silicate (600 nm) | Red 2 (648 nm) | 648 | 75 |
| 3 | Nitride (613 nm) | Red 3 (625 nm) | 625 | 37 |
| 4 | Silicate (585 nm) | Red 4 (627 nm) | 627 | 30 |
| 5 | Silicate (517 nm) | Green 1 (525 nm) | 532 | 40 |
| 6 | Silicate (520 nm) | Green 2 (525 nm) | 534 | 48 |
| 7 | Silicate (524 nm) | Green 3 (525 nm) | 535 | 56 |
| 8 | Silicate (515 nm) | Green 4 (525 nm) | 534 | 50 |
| 9 | Silicate (521 nm) | Green 5 (525 nm) | 536 | 45 |
| 10 | Silicate (520 nm) | Red (625 nm)/ | 530 | 26 |
|  |  | Green 1 (525 nm) | 623 | 38 |
| 11 | Silicate (520 nm) | Red (625 nm)/ | 533 | 25 |
|  |  | Green 2 (525 nm) | 621 | 49 |
| 12 | Silicate (466 nm) | Green 6 (525 nm) | 466 | 44 |
|  |  |  | 528 | 38 |
| 13 | Silicate (585 nm) | Green 7 (525 nm) | 585 | 73 |

Measurement of the Light-Converting Materials Prepared

The relative spectral energy distribution of all light-converting materials obtained was recorded by means of a fibre-optic spectrometer at an excitation wavelength of 450 nm. The relative spectral energy distribution of all materials prepared (emission) is shown in FIGS. 1 to 5.

LED Evaluation

Unfilled LEDs are filled with an optical silicone (Dow Corning OE6550) in which precise amounts of red and green particles are suspended via a dispenser. The silicone suspension is prepared by means of a biaxial rotary mixer and subsequently degassed in vacuo. The LED is subsequently hardened in a drying cabinet at 150° C. for 1 h and measured with respect to the resultant light emission by means of an Ulbricht sphere using a fibre-optic spectrometer. By variation of the total amount of powder in the silicone and also of the red, yellow or green individual components, virtually any colour location in the colour triangle can be achieved.

Instead of silicone, it is also possible to use other highly transparent materials as encapsulation composition, for example epoxy resins.

Figure 7:
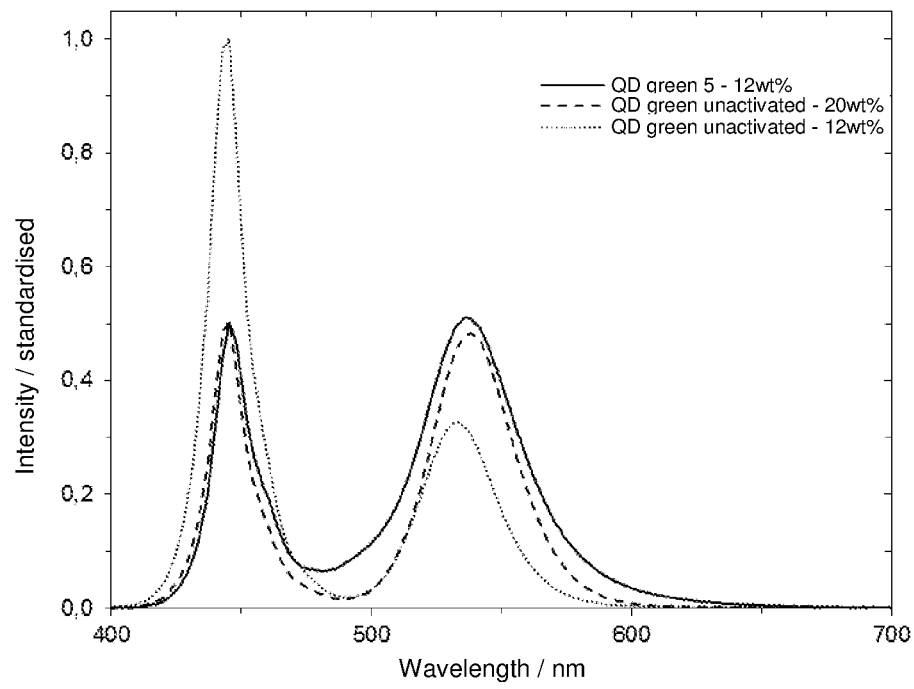
FIG. 7: Emission spectrum of the LED produced from the light-converting material from Example 9 and a blue LED ($\lambda_{max}$=450 nm) (continuous line) and emission spectrum of an LED produced from a light-converting material synthesised in the same way on unactivated orthosilicate and a blue LED ($\lambda_{max}$=450 nm) (dotted line). In the case of both LEDs, the proportion of the light-converting material in the silicone was 12% by weight. In addition, an LED was produced based on light-converting material on unactivated orthosilicate at the same colour location of the LED with the light-converting material from Example 9 (dashed line), which results in an increase in the concentration of the light-converting material in the silicone from 12% to 20% (+67%). All spectra are standardised to the highest maximum.
Figure 8:
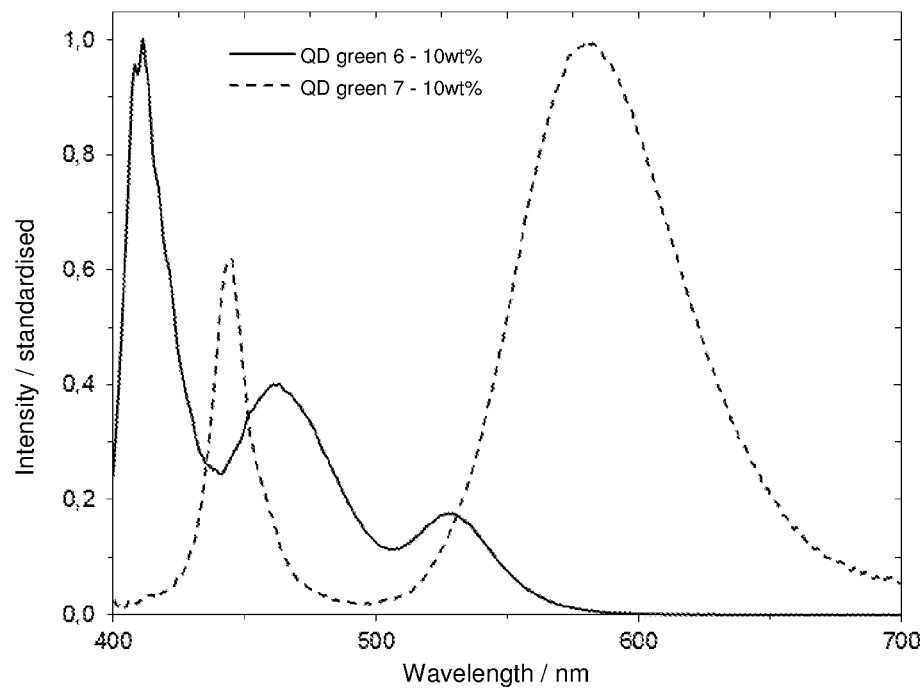
FIG. 8: Emission spectra of the LEDs produced from the light-converting material from Example 12 and a violet LED ($\lambda_{max}$=410 nm) and the light-converting material from Example 13 and a blue LED ($\lambda_{max}$=450 nm). It is illustrated here that no additional energy transfer takes place if the emission from the substrate is of more than 50 nm shorter wavelength or of more than 50 nm longer wavelength than the emission from the semiconductor nanoparticles.

Further useful advantages of the light-converting materials according to the invention are:

Due to reabsorption of the efficient emission from a luminescent material which has high absorption in the region of the primary light source, increased efficiency of the LED and significantly reduced material consumption in the LED are facilitated. This is illustrated by FIG. 7, where the consumption of a suspension based on an unactivated substrate prepared analogously increases by 67% and at the same time the efficiency drops by 22% at the same colour point.

Higher gamut coverage possible than with conventional phosphors, such as green β-SiAlON or orthosilicate in combination with red phosphor $K_2SiF_6$ due to narrower emission.

Same sedimentation behaviour over all conversion materials used in the LED, can be adjusted specifically if desired and increased production yield in the LED production process.

Simple to use, since no new production equipment is required by the LED manufacturer.

User has more opportunity to adjust the LED emission compared with conventional QD films (flexible use, since user does not have to use a different light converter for each colour location).

Increased brightness of the LED, since the red, narrow-band emission does not waste any energy in the deep long-wave spectral region with low eye sensitivity.

Existing coating technologies for phosphors can be used; additional barrier films are not necessary.

The invention claimed is:

1. Light-converting material comprising a luminescent material being in a form of macroscopic particles and at least one type of semiconductor nanoparticles, wherein the semiconductor nanoparticles are located on the surface of the luminescent material and the emission from the semiconductor nanoparticles is in the region of the emission from the luminescent material, wherein the at least one type of semiconductor nanoparticles includes a plurality of semiconductor nanoparticles, wherein a maximum of a core exciton absorption band of the semiconductor nanoparticles and an emission maximum of the luminescent material are a maximum of 50 nm apart, an overlap AOL between an emission band of the luminescent material and the core exciton absorption band of the semiconductor nanoparticles being at least 80%, based on a total area of the core exciton excitation band Aex such that the following equation applies:

$A_{OL}/A_{ex}*100\% > 80\%$, wherein the following equation (1) applies for an emission maximum $\lambda_{em,max}$ of the semiconductor nanoparticles and an emission maximum $\lambda_{em,max}$ of the luminescent material:

0 nm ≤ $\lambda_{em,max}$(semiconductor nanoparticles) − $\lambda_{em,max}$(luminescent material) ≤ 30 nm (2).

2. Light-converting material according to claim 1, where the emission band of the semiconductor nanoparticles and the emission band of the luminescent material fully or partly overlap.

3. Light-converting material according to claim 1, where the luminescent material is a phosphor.

4. Light-converting material according to claim 1, characterised in that the luminescent material is an inorganic phosphor activated by Eu(II), Ce(III), Mn(II), Mn(IV), Eu(III), Tb(III), Sm(III), Cr(III), Sn(II), Pb(II), Sb(III), Bi(III), Cu(I) or Ag(I), selected from the list consisting of metal oxides, silicates and halosilicates, phosphates and halophosphates, borates, haloborates and borosilicates, aluminates, gallates and alumosilicates, molybdates and tungstates, sulfates, sulfides, selenides and tellurides, nitrides and oxynitrides, SiAlONs, complex metal-oxygen compounds, halogen compounds and oxy compounds.

5. Light-converting material according to claim 1, characterised in that the semiconductor nanoparticles comprise at least two different semiconductor materials.

6. Light-converting material according to claim 5, characterised in that the semiconductor materials are selected from group II-VI semiconductors, group III-V semiconductors, group IV-VI semiconductors, group I-III-VI2 semiconductors and alloys and/or combinations of these semiconductors, where the semiconductor materials may optionally be doped with one or more transition metals.

7. Light-converting material according to claim 1, characterised in that the semiconductor nanoparticles are in the form of nanodots, nanorods, nanoflakes, nanotetrapods, nanodots in nanorods, nanorods in nanorods and/or nanodots in nanoflakes.

8. Process for the preparation of a light-converting material according to claim 1, where the process comprises the following steps: (A) provision of a luminescent material suspension in a solvent; and (B) addition of a semiconductor nanoparticle suspension in a solvent.

9. Light-converting mixture comprising one or more of the light-converting materials according to claim 1.

10. A process comprising partial or complete conversion of ultraviolet and/or blue light into light having a longer wavelength by passing said light through a light converting material according to claim 1.

11. Light source comprising at least one primary light source and at least one light-converting material according to claim 1.

12. Light source according to claim 11, characterised in that the light- converting material or the light-converting mixture is arranged directly on the primary light source or is arranged on a support material remote from the primary light source.

13. Process for the production of a light source according to claim 11, where the light-converting material or the light-converting mixture is applied to the primary light source or the support material in the form of a film by spin coating or spray coating or in the form of a sheet as laminate.

14. Lighting unit containing at least one light source according to claim 13.

* * * * *